United States Patent
Chung

(10) Patent No.: US 8,803,562 B2
(45) Date of Patent: Aug. 12, 2014

(54) STAGE CIRCUIT AND SCAN DRIVER USING THE SAME

(75) Inventor: Kyung-Hoon Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 278 days.

(21) Appl. No.: 13/249,091

(22) Filed: Sep. 29, 2011

(65) Prior Publication Data

US 2013/0002306 A1    Jan. 3, 2013

(30) Foreign Application Priority Data

Jun. 30, 2011    (KR) .................... 10-2011-0064437

(51) Int. Cl.
*H03K 3/00*    (2006.01)

(52) U.S. Cl.
USPC ............................................ 327/108

(58) Field of Classification Search
None
See application file for complete search history.

(56) References Cited

U.S. PATENT DOCUMENTS

| | | | | |
|---|---|---|---|---|
| 4,521,701 A * | 6/1985 | Reddy | | 327/281 |
| 7,053,684 B1 * | 5/2006 | Sen et al. | | 327/157 |
| 7,304,502 B2 * | 12/2007 | Chung | | 326/68 |
| 7,307,455 B2 * | 12/2007 | Choi et al. | | 326/82 |
| 7,583,110 B2 * | 9/2009 | Butler | | 327/112 |
| 8,040,163 B2 * | 10/2011 | Jinta | | 327/108 |

FOREIGN PATENT DOCUMENTS

| KR | 1020100087871 A | 8/2010 |
|---|---|---|
| KR | 1020100093738 A | 8/2010 |

* cited by examiner

*Primary Examiner* — Lincoln Donovan
*Assistant Examiner* — Khareem E Almo
(74) *Attorney, Agent, or Firm* — Christie, Parker & Hale, LLP

(57) ABSTRACT

A stage circuit includes an output unit including a first transistor coupled between a first power source and an output terminal of the stage circuit, and having a gate electrode coupled to a first node, a second transistor coupled between the output terminal and a third input terminal of the stage circuit, and having a gate electrode coupled to a second node, and a third transistor coupled between the output terminal and a second power source, and having a gate electrode coupled to a third node; a progressive driver coupled to first, second, and sixth input terminals of the stage circuit; and a concurrent driver coupled to at least one of fourth and fifth input terminals of the stage circuit. In the stage circuit, clock signals supplied to the first, second, and third input terminals during the second period are concurrently set to a gate-on or gate-off voltage.

30 Claims, 18 Drawing Sheets

STAGE CIRCUIT AND SCAN DRIVER USING THE SAME

CROSS-REFERENCE TO RELATED APPLICATION

This application claims priority to and the benefit of Korean Patent Application No. 10-2011-0064437, filed on Jun. 30, 2011, in the Korean Intellectual Property Office, the entire content of which is incorporated herein by reference.

BACKGROUND

1. Field

Aspects of embodiments according to the present invention relate to a stage circuit and a scan driver using the same.

2. Description of Related Art

Recently, various types of flat panel display devices have been developed with reduced weight and volume in comparison to cathode ray tubes. The flat panel display devices include a liquid crystal display, a field emission display, a plasma display panel, an organic light emitting display, and the like.

Among these flat panel display devices, the organic light emitting display displays images using organic light emitting diodes that emit light through recombination of electrons and holes. The organic light emitting display has a fast response speed and is driven with low power consumption. In a conventional organic light emitting display, current corresponding to a data signal is supplied to an organic light emitting diode using a transistor formed in each pixel so that the organic light emitting diode emits light.

The conventional organic light emitting display includes a data driver for supplying a data signal to data lines, a scan driver for sequentially supplying a scan signal to scan lines, and a display unit having a plurality of pixels coupled to the scan lines and the data lines.

When a scan signal is supplied to a scan line, pixels included in the display unit are selected to receive a data signal supplied from a data line. The pixels that receive the data signal generate light with a luminance (e.g., a predetermined luminance) corresponding to the data signal, thereby displaying an image.

The driving method of the organic light emitting display is divided into a progressive emission method and a concurrent (e.g., simultaneous) emission method. The progressive emission method refers to a method in which data is progressively inputted for each scan line, and pixels on each horizontal line are progressively emitted in the same order as the data is inputted.

The concurrent emission method refers to a method in which data is progressively inputted for each scan line, and pixels are concurrently (e.g., simultaneously) emitted after the data is inputted to all the pixels. In order to implement the concurrent emission method, a scan signal may be concurrently or progressively supplied to the scan lines.

SUMMARY

Embodiments of the present invention are directed toward a stage circuit and a scan driver using the same capable of concurrently (e.g., simultaneously) or progressively supplying a scan signal.

According to an embodiment of the present invention, there is provided a stage circuit including: an output unit including a first transistor coupled between a first power source and an output terminal of the stage circuit, and having a gate electrode coupled to a first node; a second transistor coupled between the output terminal and a third input terminal of the stage circuit, and having a gate electrode coupled to a second node; and a third transistor coupled between the output terminal and a second power source, and having a gate electrode coupled to a third node; a progressive driver coupled to first, second, and sixth input terminals of the stage circuit, the progressive driver for controlling voltages at the first, second, and third nodes so that a scan signal is progressively outputted during a first period; and a concurrent driver coupled to at least one of fourth and fifth input terminals of the stage circuit, the concurrent driver for controlling the voltages at the first, second, and third nodes so that a scan signal is concurrently supplied during a second period, wherein clock signals supplied to the first, second, and third input terminals during the second period are concurrently set to a gate-on or gate-off voltage.

The clock signals may be supplied to the first, second, and third input terminals so that supply times of the gate-on voltage are not overlapped with one another during the first period. The fourth input terminal may be set to a gate off voltage during the first period, and may be configured to receive a control signal in which gate-on and gate-off voltages are repeated, during the second period.

The progressive driver may include a fourth transistor coupled between the first power source and the second node and having a gate electrode coupled to the first node; a fifth transistor coupled between the first node and the second power source, and having a gate electrode coupled to the first input terminal; a sixth transistor coupled between the second node and the sixth input terminal, and having a gate electrode coupled to the second input terminal; and a seventh transistor coupled between the first power source and the first node, and having a gate electrode coupled to the second node.

The concurrent driver may include an eighth transistor coupled between the second power source and the third node, and having a gate electrode coupled to the fourth input terminal; a ninth transistor coupled between the first power source and the first node, and having a gate electrode coupled to the fourth input terminal; a tenth transistor coupled between the first power source and the second node, and having a gate electrode coupled to the fourth input terminal; and an eleventh transistor coupled between the first power source and the third node, and having a gate electrode coupled to the fifth input terminal.

According to an embodiment of the present invention, there is provided a scan driver including stages respectively coupled to a plurality of scan lines for supplying a scan signal to the scan lines, wherein each of the stages includes an output unit including a first transistor coupled between a first power source and an output terminal of the stage, and having a gate electrode coupled to a first node, a second transistor coupled between the output terminal and a third input terminal of the stage, and having a gate electrode coupled to a second node, and a third transistor coupled between the output terminal and a second power source having a lower voltage than that of the first power source, and having a gate electrode coupled to a third node; a progressive driver coupled to first, second, and sixth input terminals of the stage, the progressive driver for controlling voltages at the first, second, and third nodes so that a scan signal is progressively outputted during a first period; and a concurrent driver coupled to at least one of fourth and fifth input terminals of the stage, the concurrent driver for controlling the voltages at the first, second, and third nodes so that a scan signal is concurrently supplied during a second period, wherein clock signals supplied to the first, second, and third input terminals during the second period are concurrently set to a gate-on or gate-off voltage.

First, second, and third clock signals may be alternately inputted the first, second, and third input terminals of the plurality of stages during the first period. The first, second, and third clock signals may be progressively set to have the level of a gate-on voltage, and each of the first, second, and third clock signals may have a cycle of three horizontal periods and a 1/3 duty ratio.

First, third, and fifth clock signals may be alternately inputted to the first, second, and third input terminals of odd-numbered stages among the plurality of stages during the first period; and second, fourth, and sixth clock signals may be alternately inputted to the first, second, and third input terminals of even-numbered stages among the plurality of stages during the first period. The first to sixth clock signals may be progressively set to have the level of a gate-on voltage, and each of the first to sixth clock signals may have a cycle of six horizontal periods and a 1/3 duty ratio.

According to the embodiments of the present invention, the stage circuit and the scan driver using the same can concurrently (e.g., simultaneously) or progressively supply a scan signal to scan lines.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
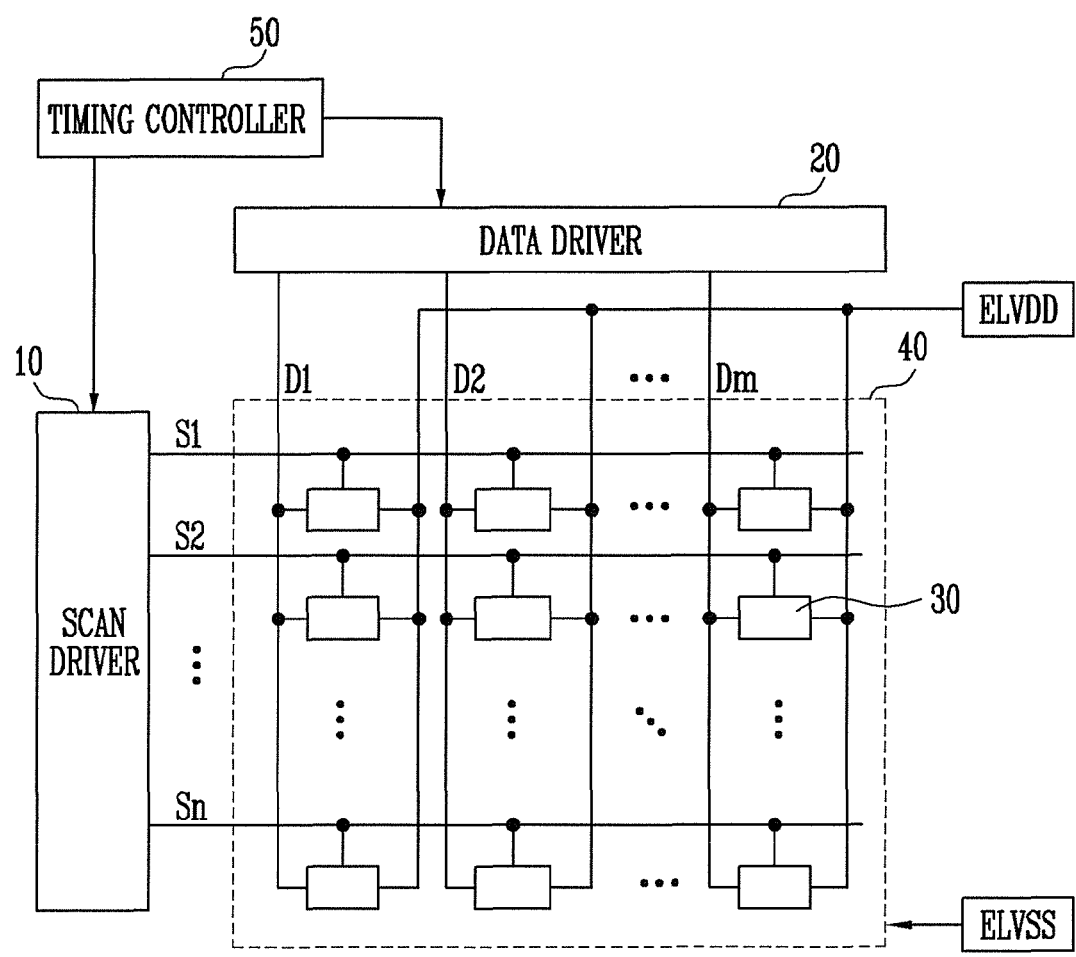
FIG. 1 is a block diagram showing an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via one or more third elements. Further, some of the elements that are not essential to the complete understanding of the invention are omitted for clarity. Also, like reference numerals refer to like elements throughout.

FIG. 1 is a block diagram showing an organic light emitting display according to an embodiment of the present invention.

Referring to FIG. 1, the organic light emitting display according to this embodiment includes a display unit 40 having pixels 30 positioned at crossing regions of scan lines S1 to Sn and data lines D1 to Dm; a scan driver 10 for driving the scan lines S1 to Sn; a data driver 20 for driving the data lines D1 to Dm; and a timing controller 50 for controlling the scan driver 10 and the data driver 20.

The scan driver 10 supplies a scan signal to the scan lines S1 to Sn. When the scan signal is supplied to the scan lines S1 to Sn, pixels 30 are selected. Here, the scan driver 10 concurrently (e.g., simultaneously) or progressively supplies the scan signal to the scan lines S1 to Sn, according to a driving method. To this end, the scan driver 10 includes stage circuits respectively coupled to the scan lines S1 to Sn.

The data driver 20 supplies a data signal to the data lines D1 to Dm in synchronization with the scan signal. Here, the data signal is supplied in synchronization with the progressively supplied scan signal.

The timing controller 50 supplies control signals for controlling the scan driver 10 and the data driver 20. The timing controller 50 supplies data supplied from the outside thereof to the data driver 20.

Each of the pixels 30 stores a voltage corresponding to the data signal, and generates light with a set or predetermined luminance while supplying current corresponding to the stored voltage to an organic light emitting diode (not shown).

Figure 2:
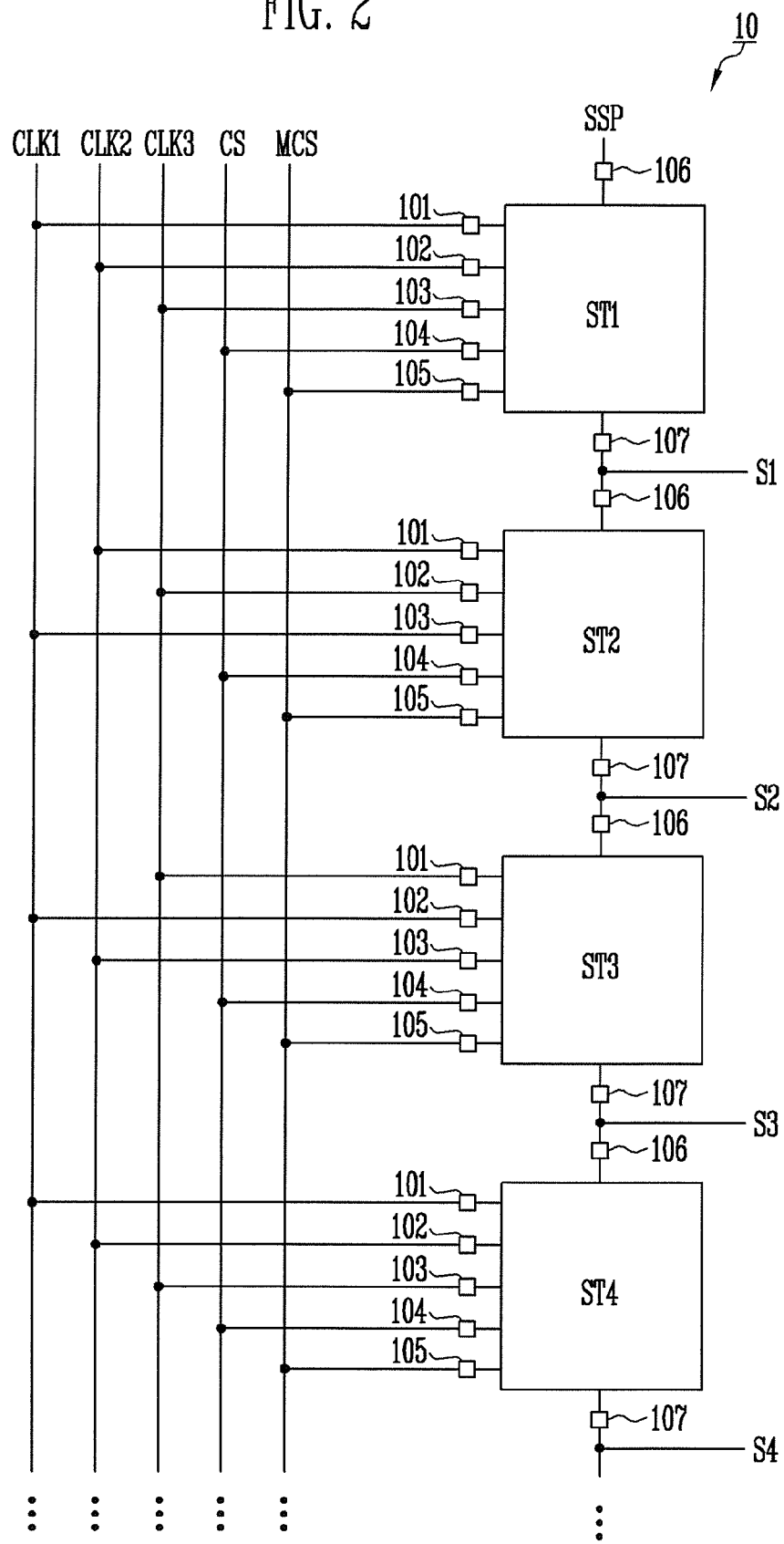
FIG. 2 is a block diagram showing a first embodiment of a scan driver shown in FIG. 1.

FIG. 2 is a block diagram showing a first embodiment of the scan driver shown in FIG. 1. For convenience of illustration, four stages are shown in FIG. 2.

Referring to FIG. 2, the scan driver 10 according to this embodiment includes stages ST1 to ST4 respectively coupled to scan lines S1 to S4. The stages ST1 to ST4 have the same circuit configuration, and concurrently (e.g., simultaneously) or progressively output a scan signal.

Each of the stages ST1 to ST4 is coupled to any one of the scan lines S1 to S4. Each of the stages ST1 to ST4 is driven by three clock signals (CLK1, CLK2 and CLK3) and two control signals (MCS and CS).

Each of the stages ST1 to ST4 includes a first input terminal 101, a second input terminal 102, a third input terminal 103, a fourth input terminal 104, a fifth input terminal 105, a sixth input terminal 106, and an output terminal 107.

The first, second, and third input terminals 101, 102, and 103 included in an i-th stage (where i is 1, 4, 7, ... ) receive the first, second, and third clock signals CLK1, CLK2, and CLK3, respectively.

The first, second, and third input terminals 101, 102, and 103 included in an (i+1)-th stage receive the second, third, and first clock signals CLK2, CLK3, and CLK1, respectively.

The first, second, and third input terminals 101, 102, and 103 included in an (i+2) stage receive the third, first, and second clock signals CLK3, CLK1, and CLK2, respectively.

The first, second, and third clock signals CLK1, CLK2, and CLK3 are progressively supplied (e.g., a low level signal) so as not to overlap with one another. For example, when the time taken to scan one scan line is one horizontal period (1H), each of the clock signals CLK1, CLK2, and CLK3 has a cycle of 3H, and the duty ratio of each of the clock signals CLK1, CLK2, and CLK3 is 1/3. The phase difference between two adjacent clock signals is 1H. In this case, while one clock signal (e.g., CLK1) is supplied (e.g., a low level signal), the other clock signals (e.g., CLK2 and CLK3) are not supplied (e.g., a high level signal).

The fourth, fifth, and sixth input terminals 104, 105, and 106 included in each of the stages ST1 to ST4 receive a control signal CS, a mode control signal MCS, and an output signal of the previous stage, respectively. However, the sixth input terminal 106 of the first stage ST1 receives a start signal SSP.

The mode control signal MCS and the control signal CS are used to concurrently (e.g., simultaneously) supply a scan signal in the scan driver 10. For example, in a case where the mode control signal MCS is set to a gate-off voltage (e.g., a high level signal) and the control signal CS is set to a gate-on voltage (e.g., a low level signal), the scan signal is concurrently (e.g., simultaneously) supplied to the scan lines S1 to Sn by the scan driver 10.

Figure 3:
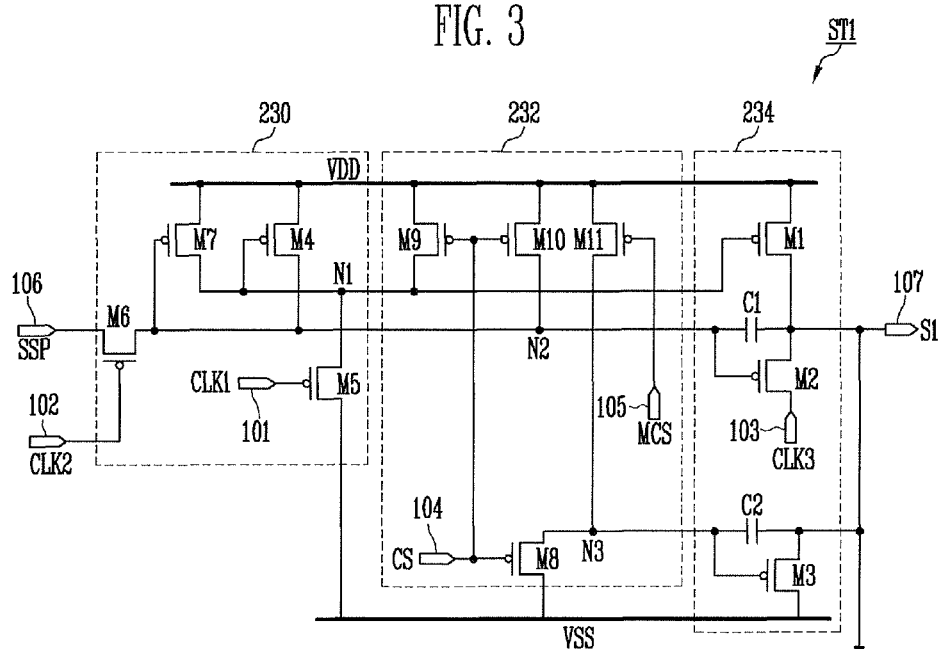
FIG. 3 is a circuit diagram schematically showing a first embodiment of a stage.

FIG. 3 is a circuit diagram schematically showing a first embodiment of the stage shown in FIG. 2. For convenience of illustration, the first stage ST1 is shown in FIG. 3. Although it has been illustrated in FIG. 3 that transistors M1 to M11 are formed as PMOS transistors, the present invention is not limited thereto. For example, the transistors M1 to M11 may be formed as NMOS transistors.

Referring to FIG. 3, the stage ST1 according to this embodiment includes a progressive driver 230, a concurrent driver 232, and an output unit 234.

The progressive driver 230 outputs a scan signal, corresponding to signals supplied to the first, second, and sixth input terminals 101, 102, and 106. The progressive driver 230 is used to progressively supply the scan signal to the scan lines S1 to Sn. To this end, the progressive driver 230 includes fourth to seventh transistors M4 to M7.

The fourth transistor M4 is coupled between a first power source VDD and a second node N2. A gate electrode of the fourth transistor M4 is coupled to a first node N1. The fourth transistor M4 is turned on or off, corresponding to a voltage applied to the first node N1. When the fourth transistor M4 is turned on, the voltage of the first power source VDD is supplied to the second node N2. Here, the first power source VDD is set to a gate-off voltage, e.g., a high-level voltage.

The fifth transistor M5 is coupled between the first node N1 and a second power source VSS. A gate electrode of the fifth transistor M5 is coupled to the first input terminal 101. The fifth transistor M5 is turned on when the first clock signal CLK1 is supplied to the first input terminal 101. When the fifth transistor M5 is turned on, the voltage of the second power source VSS is supplied to the first node N1. Here, the second power source VSS is set to a gate-on voltage, e.g., a low-level voltage.

The sixth transistor M6 is coupled between the sixth input terminal 106 and the second node N2. A gate electrode of the sixth transistor M6 is coupled to the second input terminal 102. The sixth transistor M6 is turned on when the second clock signal CLK2 is supplied to the second input terminal 102. When the sixth transistor M6 is turned on, the sixth input terminal 106 is electrically coupled to the second node N2.

The seventh transistor M7 is coupled between the first power source VDD and the first node N1. A gate electrode of the seventh transistor M7 is coupled to the second node N2. The seventh transistor M7 is turned on or off, corresponding to a voltage applied to the second node N2. When the seventh transistor M7 is turned on, the voltage of the first power source VDD is supplied to the first node N1.

Here, in an embodiment of the present invention, the seventh transistor M7 is formed to have a higher resistance than that of the fifth transistor M5. For example, the resistance may be adjusted by controlling the W/L ratios of the seventh and fifth transistors M7 and M5. If the seventh and fifth transistors M7 and M5 are concurrently (e.g., simultaneously) turned on when the seventh transistor M7 is formed to have a higher resistance than that of the fifth transistor M5, the voltage at the first node N1 is decreased to approximately the voltage of the second power source VSS.

The concurrent driver 232 outputs a scan signal, corresponding to a signal supplied to the fourth and fifth input terminals 104 and 105. The concurrent driver 232 is used to concurrently (e.g., simultaneously) supply the scan signal to the scan lines S1 to Sn. To this end, the concurrent driver 232 includes eighth to eleventh transistors M8 to M11.

The eighth transistor M8 is coupled between a third node N3 and the second power source VSS. A gate electrode of the eighth transistor M8 is coupled to the fourth input terminal 104. When the control signal CS is supplied (e.g., a gate-on voltage), the eighth transistor M8 is turned on to supply the voltage of the second power source VSS to the third node N3.

The ninth transistor M9 is coupled between the first power source VDD and the first node N1. A gate electrode of the ninth transistor M9 is coupled to the fourth input terminal 104. When the control signal CS is supplied, the ninth transistor M9 is turned on to supply the voltage of the first power source VDD to the first node N1.

The tenth transistor M10 is coupled between the first power source VDD and the second node N2. A gate electrode of the tenth transistor M10 is coupled to the fourth input terminal 104. When the control signal CS is supplied, the tenth transistor M10 is turned on to supply the voltage of the first power source VDD to the second node N2.

The eleventh transistor M11 is coupled between the third node N3 and the first power source VDD. A gate electrode of the eleventh transistor M11 is coupled to the fifth input terminal 105. When the mode control signal MCS is supplied (e.g., a gate-on voltage), the eleventh transistor M11 is turned on to supply the voltage of the first power source VDD to the third node N3.

The output unit 234 controls a voltage at the output terminal 107, corresponding to the voltage applied to the third input terminal 103, the first node N1, the second node N2, and the third node N3. To this end, the output unit 234 includes first to third transistors M1 to M3, a first capacitor C1, and a second capacitor C2.

The first transistor M1 is coupled between the first power source VDD and the output terminal 107. A gate electrode of the first transistor M1 is coupled to the first node N1. The first transistor M1 is turned on or off, corresponding to the voltage applied to the first node N1. When the first transistor M1 is turned on, the voltage of the first power source VDD is supplied to the output terminal 107.

The second transistor M2 is coupled between the output terminal 107 and the third input terminal 103. A gate electrode of the second transistor M2 is coupled to the second node N2. The second transistor M2 is turned on or off, corresponding to the voltage applied to the second node N2. When the second transistor M2 is turned on, the third clock signal CLK3 inputted to the third input terminal 103 is supplied to the output terminal 107.

The third transistor M3 is coupled between the output terminal 107 and the second power source VSS. A gate electrode of the third transistor M3 is coupled to the third node N3. The third transistor M3 is turned on or off, corresponding to the voltage applied to the third node N3. When the third transistor M3 is turned on, the voltage of the second power source VSS is supplied to the output terminal 107.

The first capacitor C1 is coupled between the output terminal 107 and the second node N2. The first capacitor C1 is charged with a voltage corresponding to the turned-on or turned-off state of the second transistor M2, and controls the voltage at the second node N2, corresponding to the voltage supplied to the output terminal 107.

The second capacitor C2 is coupled between the output terminal 107 and the third node N3. The second capacitor C2 is charged with a voltage corresponding to the turned-on or turned-off state of the third transistor M3, and controls the voltage at the third node N3, corresponding to the voltage supplied to the output terminal 107.

Figure 4:
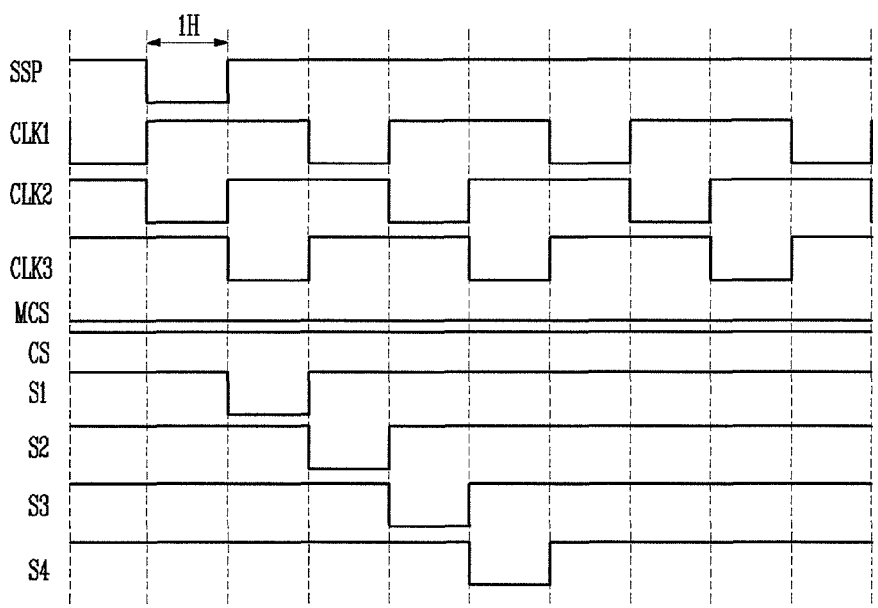
FIG. 4 is a waveform diagram illustrating a driving method for progressively outputting a scan signal in the scan driver of FIG. 2.

FIG. 4 is a waveform diagram illustrating a driving method for progressively outputting a scan signal by the scan driver of FIG. 2.

Referring to FIG. 4, during a period in which a scan signal is progressively supplied, the mode control signal MCS is set to a gate-on voltage (e.g., a low level signal), and the control signal CS is set to a gate-off voltage (e.g., a high level signal).

When the control signal CS is set to the gate-off voltage, the eighth to tenth transistors M8 to M10 are turned off.

When the mode control signal MCS is set to the gate-on voltage, the eleventh transistor M11 is turned on. When the eleventh transistor M11 is turned on, the voltage of the first power source VDD is supplied to the third node N3, and accordingly, the third transistor M3 is turned off.

Then, the start signal SSP (e.g., a low level signal) and the second clock signal CLK2 (e.g., a low level signal) are supplied so that the control signal CS and the mode control signal MCS are synchronized with each other. When the second clock signal CLK2 is supplied, the sixth transistor M6 is turned on. When the sixth transistor M6 is turned on, the second node N2 is electrically coupled to the sixth input terminal 106. In this case, the start signal SSP is supplied to the second node N2 so that the seventh and second transistors M7 and M2 are turned on.

When the seventh transistor M7 is turned on, the voltage of the first power source VDD is supplied to the first node N1, and accordingly, the first transistor M1 is turned off. When the second transistor M2 is turned on, the output terminal 107 is electrically coupled to the third input terminal 103. In this instance, the third clock signal CLK3 is not supplied to the third input terminal 103, and hence the scan signal is not supplied to the output terminal 107 (e.g., a high-level voltage is supplied). Here, a voltage corresponding to the turned-on state of the second transistor M2 is charged in the first capacitor C1 during a period in which the second transistor M2 is turned on.

Then, the supply of the second clock signal CLK2 is stopped, and the third clock signal CLK3 is supplied. When the supply of the second clock signal CLK2 is stopped, the sixth transistor M6 is turned off. In this instance, the second and seventh transistors M2 and M7 maintain a turned-on state, corresponding to the voltage charged in the first capacitor C1.

Since the second transistor M2 maintains the turned-on state, the third clock signal CLK3 supplied to the third input terminal 103 is supplied to the output terminal 107. The third clock signal CLK3 supplied to the output terminal 107 is supplied as a scan signal to the scan line S1 and concurrently (e.g., simultaneously) supplied to the next stage ST2. In this instance, the first capacitor C1 controls the voltage at the second node N2, corresponding to the voltage of the output terminal 107. Accordingly, the second transistor M2 stably maintains the turned-on state.

After the scan signal is supplied to the output terminal 107, the first clock signal CLK1 is supplied. When the first clock signal CLK1 is supplied, the fifth transistor M5 is turned on. When the fifth transistor M5 is turned on, the voltage of the second power source VSS is supplied to the first node N1. In this instance, the first node N1 is coupled to the first power source VDD via the seventh transistor M7. The first node N1 is coupled to the second power source VSS via the fifth transistor M5. Here, the seventh transistor M7 has a higher resistance than that of the fifth transistor M5, and hence the voltage at the first node N1 is decreased to approximately the voltage of the second power source VSS.

When the voltage of the second power source VSS is supplied to the first node N1, the first and fourth transistors M1 and M4 are turned on. When the fourth transistor M4 is turned on, the voltage of the first power source VDD is supplied to the second node N2, and accordingly, the second and seventh transistors M2 and M7 are turned off. When the first transistor M1 is turned on, the voltage of the first power source VDD is supplied to the output terminal 107 (i.e., the supply of the scan signal is stopped).

Here, the second stage ST2 receives an output signal of the first stage ST1 in synchronization with the third clock signal CLK3. Accordingly, the second stage ST2 outputs a scan signal to the second scan line S2 in synchronization with the first clock signal CLK1. The third stage ST3 receives an output signal of the second stage ST2 in synchronization with the first clock signal CLK1. Accordingly, the third stage ST3 outputs a scan signal to the third scan line S3 in synchronization with the second clock signal CLK2.

Practically, the scan driver 10 can progressively output the scan signal to the scan lines S1 to Sn by repeating the process described above.

Figure 5:
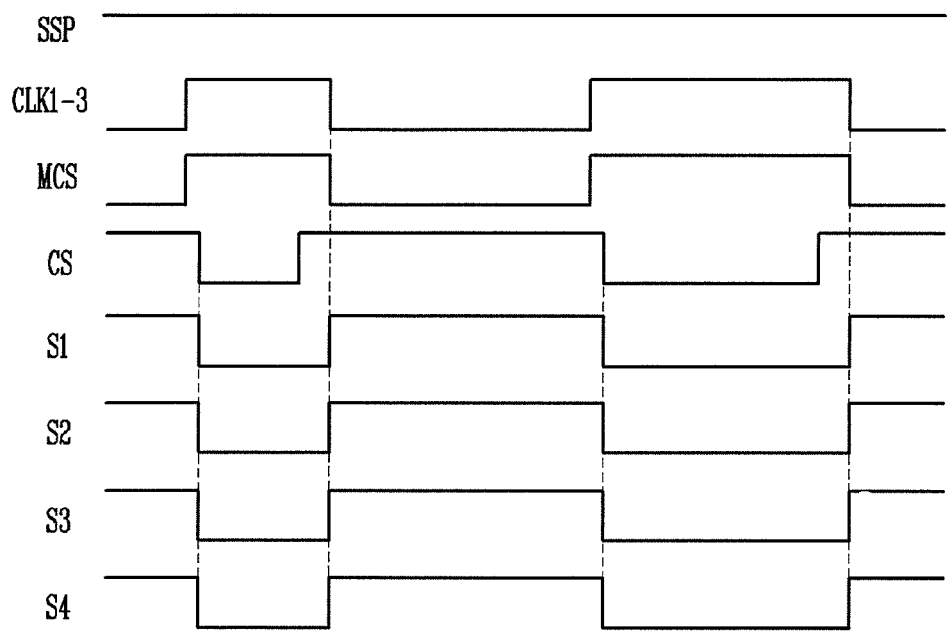
FIG. 5 is a waveform diagram illustrating a driving method for concurrently (e.g., simultaneously) outputting a scan signal in the scan driver of FIG. 2.

FIG. 5 is a waveform diagram illustrating a driving method for concurrently (e.g., simultaneously) outputting a scan signal by the scan driver of FIG. 2.

Referring to FIG. 5, the start signal SSP is not supplied (i.e., a gate-off voltage) during a period in which the scan signal is concurrently (e.g., simultaneously) outputted.

The gate-on voltage and the gate-off voltage are repeated so that the mode control signal MCS and the clock signals CLK1 to CLK3 are synchronized with one another. The control signal CS is set to a gate-on voltage during at least a part of the period in which the mode control signal MCS with the gate-off voltage is supplied. The control signal CS is set to a gate-off voltage during the other period.

When the mode control signal MCS and the clock signals CLK1 to CLK3 are set to the gate-off voltage, the fifth, sixth, and eleventh transistors M5, M6, and M11 are turned off.

When the control signal CS is supplied (i.e., the gate-on voltage), the eighth, ninth, and tenth transistors M8, M9 and M10 are turned on. When the ninth transistor M9 is turned on, the voltage of the first power source VDD is supplied to the first node N1, and accordingly, the first transistor M1 is turned off. When the tenth transistor M10 is turned on, the voltage of the first power source VDD is supplied to the second node N2, and accordingly, the second transistor M2 is turned off.

When the eighth transistor M8 is turned on, the voltage of the second power source VSS is supplied to the third node N3, and accordingly, the third transistor M3 is turned on. When the third transistor M3 is turned on, the voltage of the second power source VSS is supplied, and accordingly, the scan signal is concurrently (e.g., simultaneously) supplied to the scan lines S1 to Sn. The second capacitor C2 controls the voltage at the third node N3 corresponding to the voltage of the output terminal 107, and accordingly, the third transistor M3 maintains a turned-on state. In other words, the second capacitor C2 decreases the voltage at the third node N3 corresponding to the voltage of the second power source VSS of the output terminal 107 (bootstrap operation), and accordingly, the third transistor M3 maintains the turned-on state.

Then, the mode control signal MCS and the clock signals CLK1 to CLK3 are set to the gate-on voltage, and the supply of the control signal CS is stopped.

When the supply of the control signal CS is stopped, the eighth to tenth transistors M8 to M10 are turned off.

When the mode control signal MCS is supplied, the eleventh transistor M11 is turned on. When the eleventh transistor M11 is turned on, the voltage of the first power source VDD is supplied to the third node N3, and accordingly, the third transistor M3 is turned off.

When the clock signals CLK1 to CLK3 are supplied, the fifth and sixth transistors M5 and M6 are turned on. When the fifth transistor M5 is turned on, the voltage of the second power source VSS is supplied to the first node N1. When the voltage of the second power source VSS is supplied to the first node N1, the first and fourth transistors M1 and M4 are turned on.

When the first transistor M1 is turned on, the voltage of the first power source VDD is supplied to the output terminal 107. When the fourth transistor M4 is turned on, the voltage of the first power source VDD is supplied to the second node N2, and accordingly, the seventh and second transistors M7 and M2 are turned off.

As described above, in an embodiment of the present invention, the scan signal can be concurrently (e.g., simultaneously) supplied to the scan lines S1 to Sn, or the supply of the scan signal can be stopped by using the first control signal CS1, the mode control signal MCS, and the clock signals CLK1 to CLK3.

Figure 6:
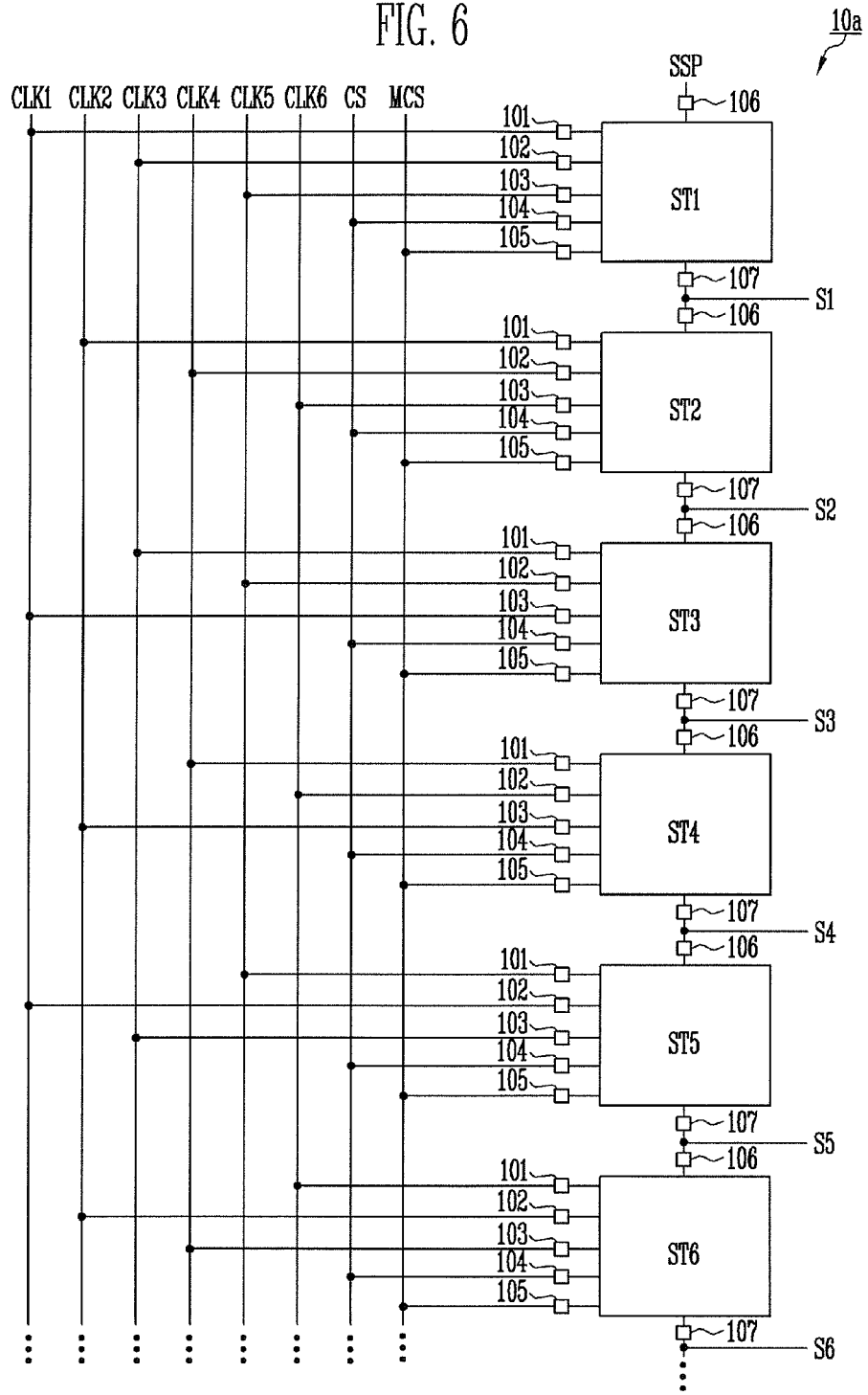
FIG. 6 is a block diagram showing a second embodiment of the scan driver shown in FIG. 1.

FIG. 6 is a block diagram showing a second embodiment of the scan driver shown in FIG. 1. For convenience of illustration, six stages are shown in FIG. 6.

Referring to FIG. 6, the scan driver 10a according to this embodiment includes stages ST1 to ST6 respectively coupled to scan lines S1 to S6. The stages ST1 to ST6 are configured as the circuit shown in FIG. 3, and concurrently (e.g., simultaneously) or progressively output a scan signal.

First, third, and fifth clock signals CLK1, CLK3, and CLK5 are alternately inputted to first to third input terminals 101 to 103 of the odd-numbered stages ST1, ST3, and ST5.

Second, fourth, and sixth clock signals CLK2, CLK4, and CLK6 are alternately inputted to the first to third input terminals 101 to 103 of the even-numbered stages ST2, ST4, and ST6.

Specifically, the first, third, and fifth clock signals CLK1, CLK3, and CLK5 are inputted to the first, second, and third input terminals 101, 102, and 103 of a j-th stage (where j is 1, 7, 13, . . . ) STj, respectively. The third, fifth, and first clock signals CLK3, CLK5, and CLK1 are inputted to the first, second, and third input terminals 101, 102, and 103 of a (j+2)-th stage STj+2, respectively. The fifth, first, and third clock signals CLK5, CLK1, and CLK3 are inputted to the first, second, and third input terminals 101, 102, and 103 of an (j+4)-th stage STj+4, respectively.

The second, fourth, and sixth clock signals CLK2, CLK4, and CLK6 are inputted to the first, second, and third input terminals 101, 102, and 103 of a (j+1)-th stage STj+1, respectively. The fourth, sixth, and second clock signals CLK4, CLK6, and CLK2 are inputted to the first, second, and third input terminals 101, 102 and 103 of a (j+3)-th stage STj+3, respectively. The sixth, second, and fourth clock signals CLK6, CLK2, and CLK4 are inputted to the first, second, and third input terminals 101, 102, and 103 of a (j+5)-th stage STj+5, respectively.

Figure 7:
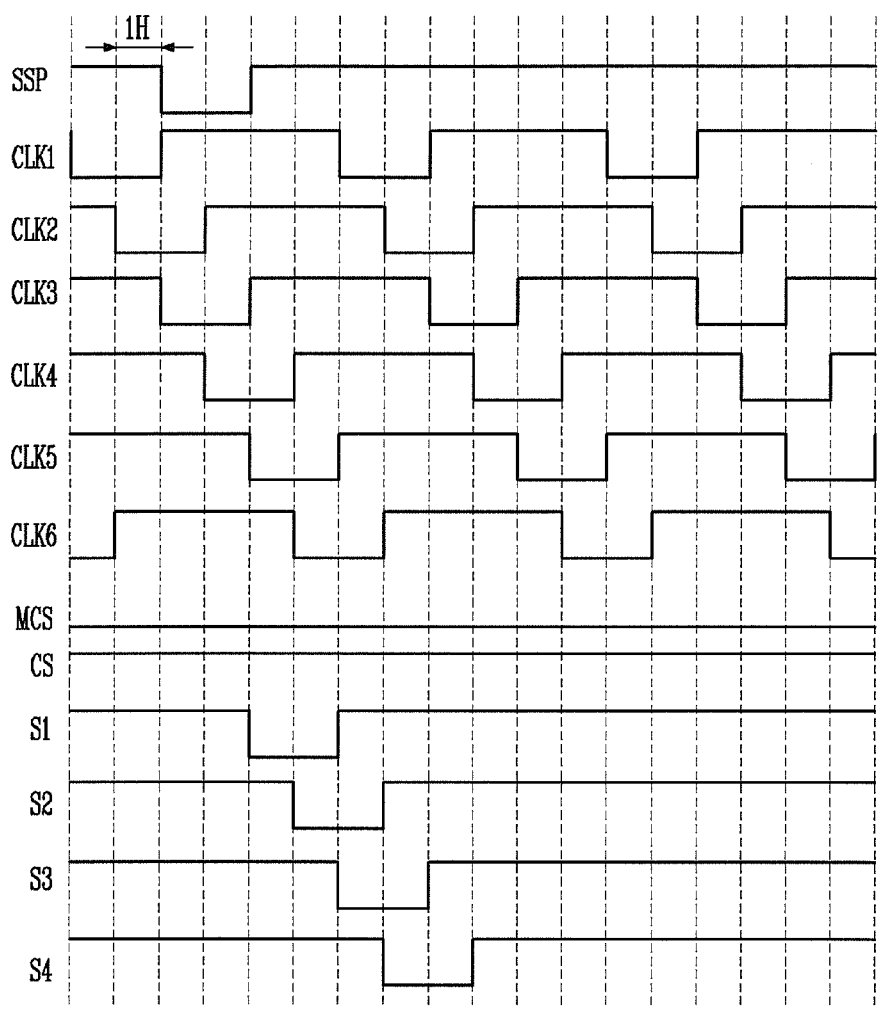
FIG. 7 is a waveform diagram illustrating a driving method for progressively outputting a scan signal in the scan driver of FIG. 6.

As shown in FIG. 7, each of the clock signals CLK1 to CLK6 has a period of 6H, and the duty ratio of each of the clock signals CLK1 to CLK6 is 1/3. The phase difference between two adjacent clock signals is set to 1H. In this case, each of the clock signals CLK1 to CLK6 is supplied during a period of 2H. Each of the clock signals CLK1 to CLK6 is overlapped with an adjacent clock signal during a period of 1H.

FIG. 7 is a waveform diagram illustrating a driving method for progressively outputting a scan signal by the scan driver of FIG. 6.

Referring to FIG. 7, during a period in which a scan signal is progressively outputted, the mode control signal MCS is set to a gate-on voltage (e.g., a low level signal) and the control signal CS is set to a gate-off voltage (e.g., a high level signal).

The start signal SSP is supplied to the first stage ST1 so as to be overlapped with the third clock signal CLK3. Then, the first stage ST1 outputs the scan signal to the first scan line S1 in synchronization with the fifth clock signal CLK5.

The scan signal outputted to the first scan line 51 is supplied to the second stage ST2 so as to be overlapped with the fourth clock signal CLK4. Then the second clock stage ST2 outputs the scan signal to the second scan line S2 in synchronization with the sixth clock signal CLK6.

The scan signal outputted to the second scan line S2 is supplied to the third stage ST3 so as to be overlapped with the fifth clock signal CLK5. Then, the third stage ST3 outputs the scan signal to the third scan line S3 in synchronization with the first clock signal CLK1.

The scan signal outputted to the third scan line S3 is supplied to the fourth stage ST4 so as to be overlapped with the sixth clock signal CLK6. Then, the fourth stage ST4 outputs the scan signal to the fourth scan line S4 in synchronization with the second clock signal CLK2.

The scan signal outputted to the fourth scan line S4 is supplied to the fifth stage ST5 so as to be overlapped with the first clock signal CLK1. Then, the fifth stage ST5 outputs the scan signal to the fifth scan line S5 in synchronization with the third clock signal CLK3.

The scan signal outputted to the fifth scan line S5 is supplied to the sixth stage ST6 so as to be overlapped with the second clock signal CLK2. Then, the sixth stage ST6 outputs the scan signal to the sixth scan line S6 in synchronization with the fourth clock signal CLK4.

Practically, the scan driver of an embodiment according to the present invention progressively outputs a scan signal to the scan lines S1 to Sn by repeating the process described above. In this case, the scan signal supplied to the scan lines S1 to Sn is overlapped with the previous scan signal during a partial period (i.e., 1H). That is, in an embodiment according to the present invention, the connection between stages is controlled, so that the scan signal can be supplied in various manners.

Figure 8:
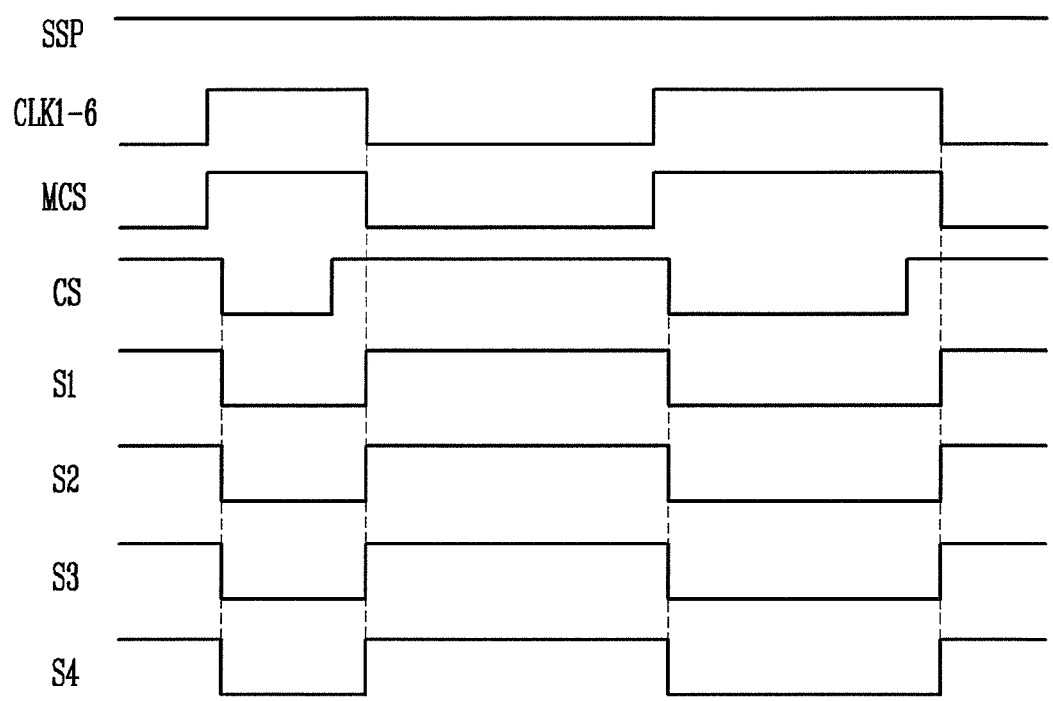
FIG. 8 is a waveform diagram illustrating a driving method for concurrently (e.g., simultaneously) outputting a scan signal in the scan driver of FIG. 6.

FIG. 8 is a waveform diagram illustrating a driving method for concurrently (e.g., simultaneously) outputting a scan signal by the scan driver of FIG. 6.

Referring to FIG. 8, the start signal SSP is not supplied (i.e., a gate-off voltage) during a period in which a scan signal is concurrently (e.g., simultaneously) outputted. The mode control signal MCS and the clock signals CLK1 to CLK6 repeat gate-on and gate-off voltages so as to overlap with one another. The control signal CS is set to a gate-on voltage during one portion of the period in which the mode control signal MCS having the gate-off voltage is supplied. The control signal CS is set to a gate-off voltage during the other portion of the period.

Then, the scan signal can be concurrently (e.g., simultaneously) supplied to the scan lines 51 to Sn, corresponding to the control signal CS. The concurrent driving method is substantially identical to that of FIG. 5, and therefore, its detailed description will be omitted.

Figure 9:
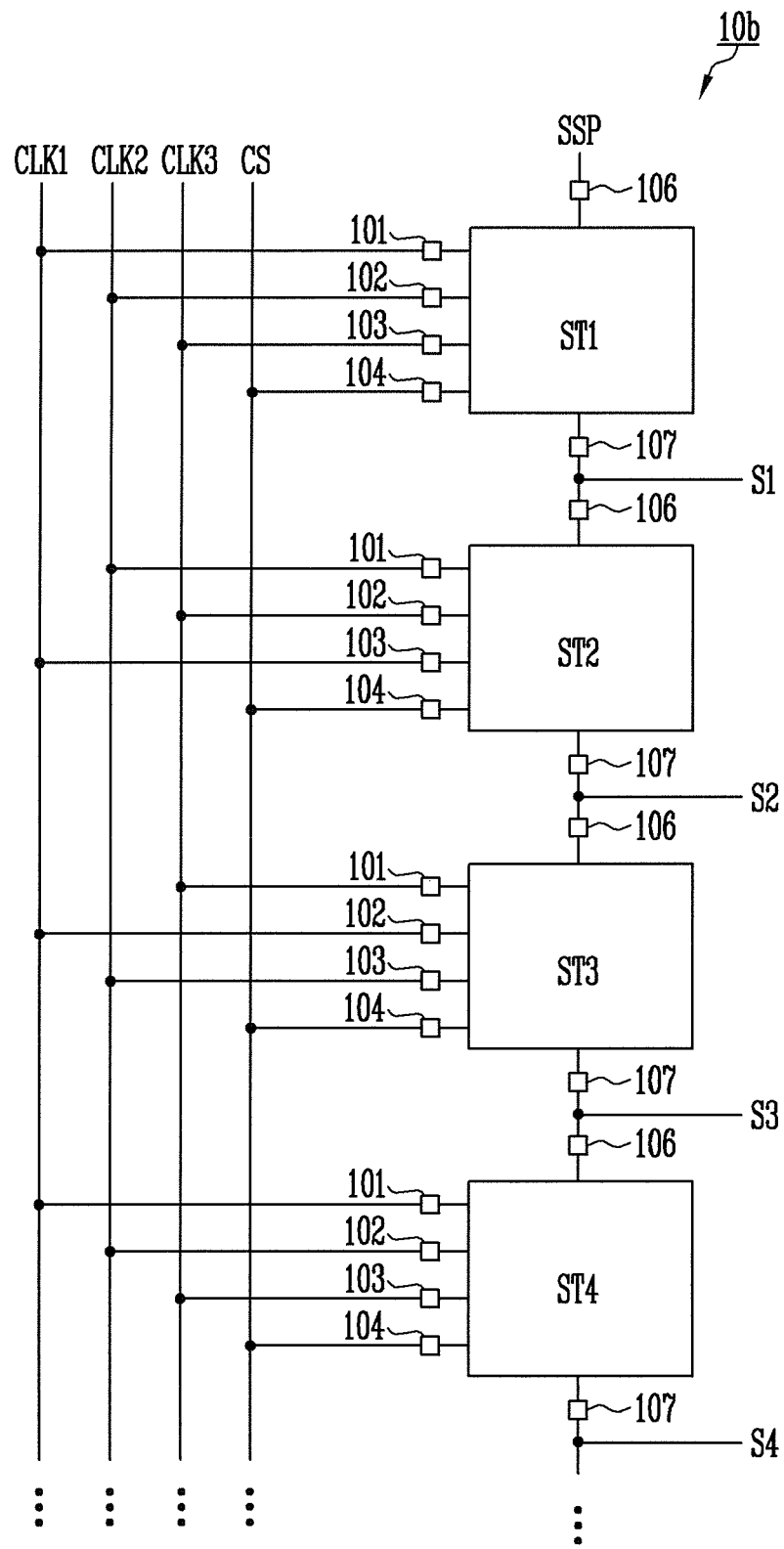
FIG. 9 is a block diagram showing a third embodiment of the scan driver shown in FIG. 1.

FIG. 9 is a block diagram showing a third embodiment of the scan driver shown in FIG. 1. In the description of FIG. 9, detailed descriptions of components identical to those of FIG. 2 will be omitted.

Referring to FIG. 9, a scan driver 10b according to this embodiment does not receive the mode control signal MCS. That is, the fifth input terminal 105 is removed, as compared with the configuration of FIG. 2. Other components are identical to those of FIG. 2, and therefore, their detailed descriptions will be omitted.

Figure 10:
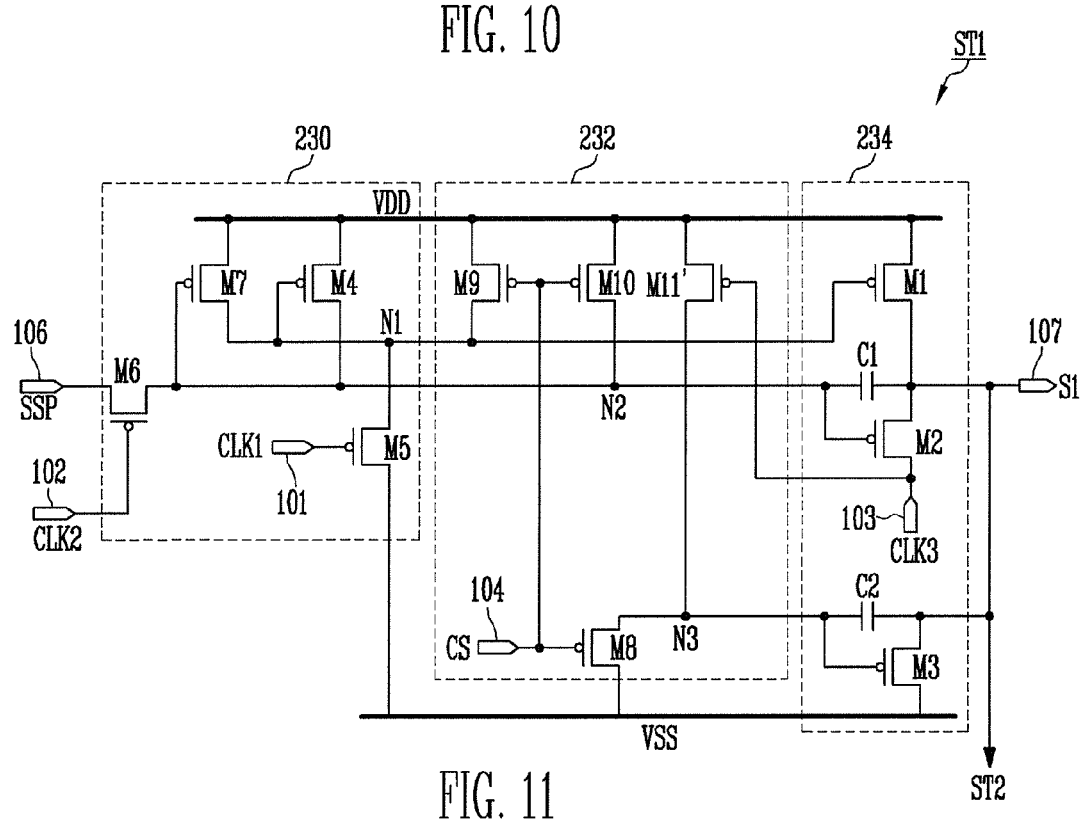
FIG. 10 is a circuit diagram schematically showing a second embodiment of the stage.

FIG. 10 is a circuit diagram schematically showing a second embodiment of the stage. In the description of FIG. 10, detailed descriptions of components identical to those of FIG. 3 will be omitted.

Referring to FIG. 10, the stage according to this embodiment includes an eleventh transistor M11' coupled between the first power source VDD and the third node N3. A gate electrode of the eleventh transistor M11' is coupled to the third input terminal 103.

When the third clock signal CLK3 is supplied, the eleventh transistor M11' is turned on so as to supply the voltage of the first power source VDD to the third node N3.

Figure 11:
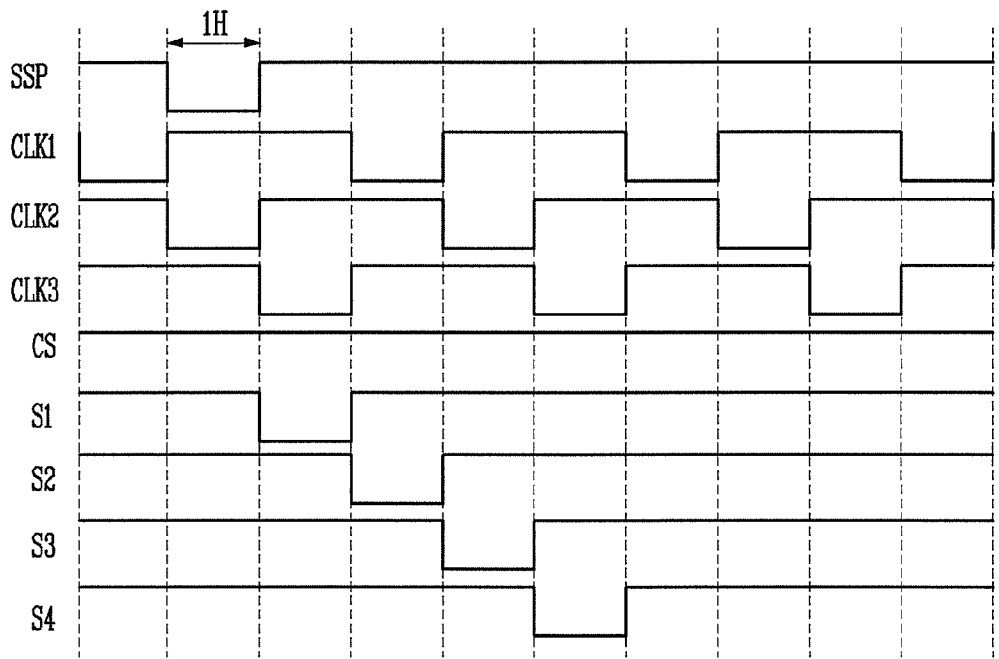
FIG. 11 is a waveform diagram illustrating a driving method for progressively outputting a scan signal in the scan driver of FIG. 9.

FIG. 11 is a waveform diagram illustrating a driving method for progressively outputting a scan signal by the scan driver of FIG. 9.

Referring to FIG. 11, the control signal CS is set to a gate-off voltage during a period in which the scan signal is progressively supplied. When the control signal CS is set to the gate-off voltage, the eighth to tenth transistors M8 to M10 are set to be in a turned-off state.

In this case, the voltages at the first to third nodes N1 to N3 are controlled by the clock signals CLK1 to CLK3 regardless of the control signal CS. Particularly, whenever the third clock signal CLK3 is supplied, the third node N3 receives the voltage of the first power source VDD, and accordingly, the turned-off state is stably maintained. The other operating process is substantially identical to that of FIG. 4, and therefore, its detailed description will be omitted.

Figure 12:
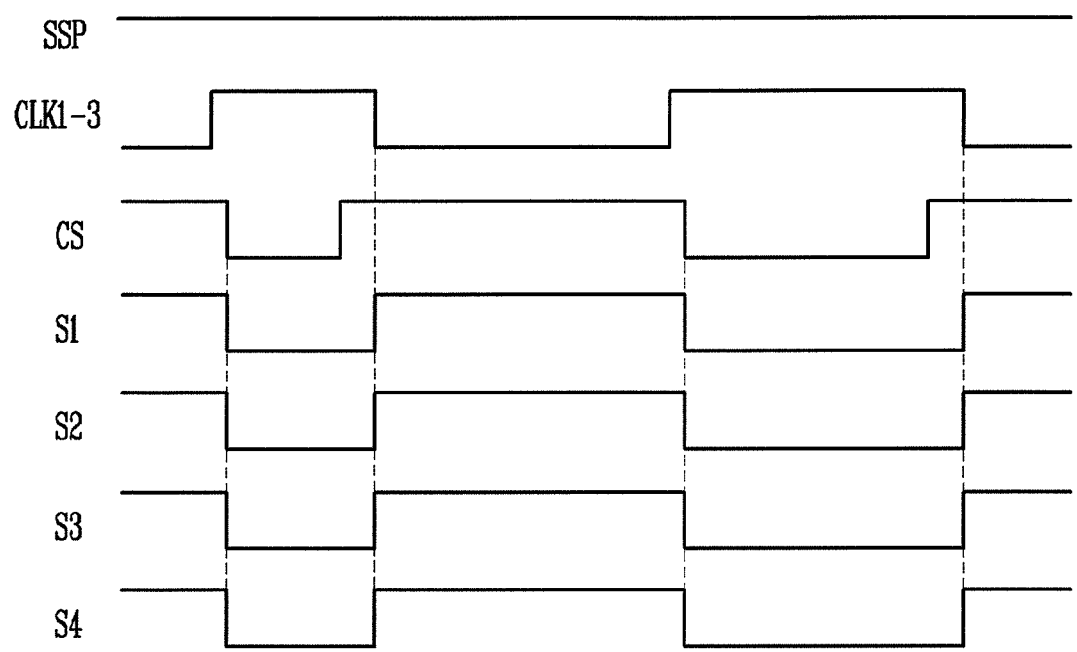
FIG. 12 is a waveform diagram illustrating a driving method for concurrently (e.g., simultaneously) outputting a scan signal in the scan driver of FIG. 9.

FIG. 12 is a waveform diagram illustrating a driving method for concurrently (e.g., simultaneously) outputting a scan signal by the scan driver of FIG. 9.

Referring to FIG. 12, the start signal SSP is not supplied (i.e., a gate-off voltage) during the scan signal is concurrently (e.g., simultaneously) outputted. The gate-on and gate-off voltages are repeated so that the clock signals CLK1 to CLK3 are synchronized with one another. The control signal CS is set to the gate-on voltage during at least a portion of the period in which the clock signals CLK1 to CLK3 have the gate-on voltage. The control signal CS is set to the gate-off voltage during the other portion of the period.

Then, the scan signal can be concurrently (e.g., simultaneously) supplied to the scan lines S1 to Sn, corresponding to the control signal CS. Otherwise, the concurrent driving method of FIG. 12 is substantially identical to that of FIG. 5, and therefore, its detailed description will be omitted.

Figure 13:
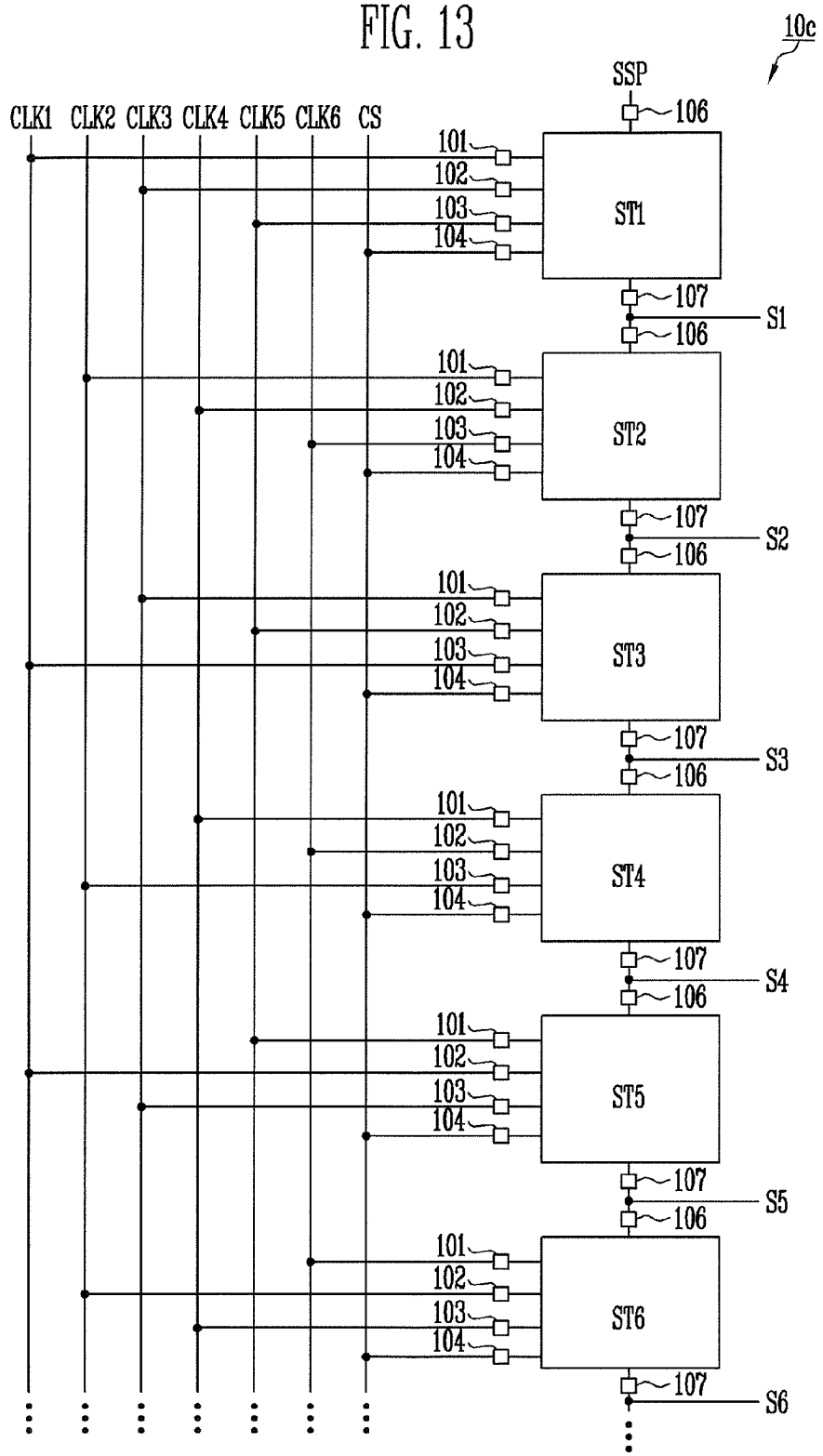
FIG. 13 is a block diagram showing a fourth embodiment of the scan driver shown in FIG. 1.

FIG. 13 is a block diagram showing a fourth embodiment of the scan driver shown in FIG. 1. In the description of FIG. 13, detailed descriptions of components identical to those of FIG. 6 will be omitted.

Referring to FIG. 13, a scan driver 10c according to this embodiment does not receive the mode control signal MCS. To this end, each of the stages ST1 to ST6 is configured as the stage circuit shown in FIG. 10.

Figure 14:
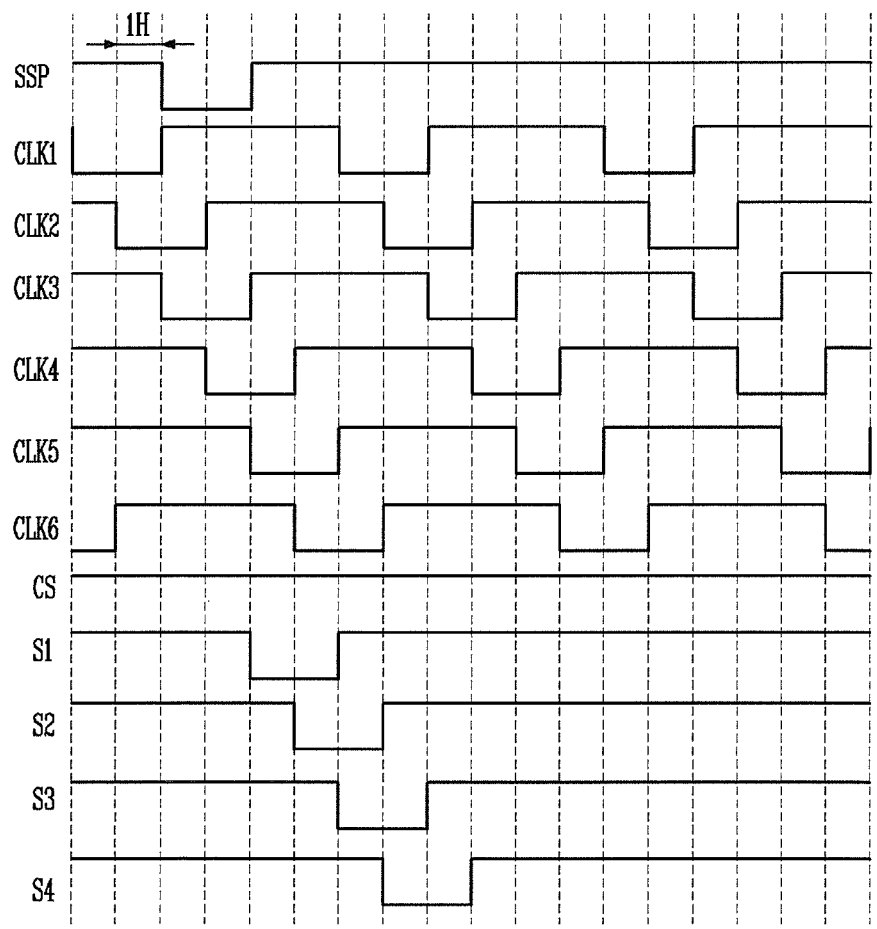
FIG. 14 is a waveform diagram illustrating a driving method for progressively outputting a scan signal in the scan driver of FIG. 13.

FIG. 14 is a waveform diagram illustrating a driving method for progressively outputting a scan signal by the scan driver of FIG. 13.

Referring to FIG. 14, during a period in which a scan signal is progressively outputted, the control signal CS is set to a gate-off voltage so that the eighth to tenth transistors M8 to M10 are set to be in a turned-off state.

In this case, the voltages at the first to third nodes N1 to N3 are controlled by the clock signals CLK1 to CLK6 regardless of the control signal CS. Particularly, whenever the third clock signal is supplied to the third input terminal 103, the third node N3 receives the voltage of the first power source VDD, and accordingly, the turned-off state is stably maintained. The other operating process is substantially identical to that of FIG. 7, and therefore, its detailed description will be omitted.

Figure 15:
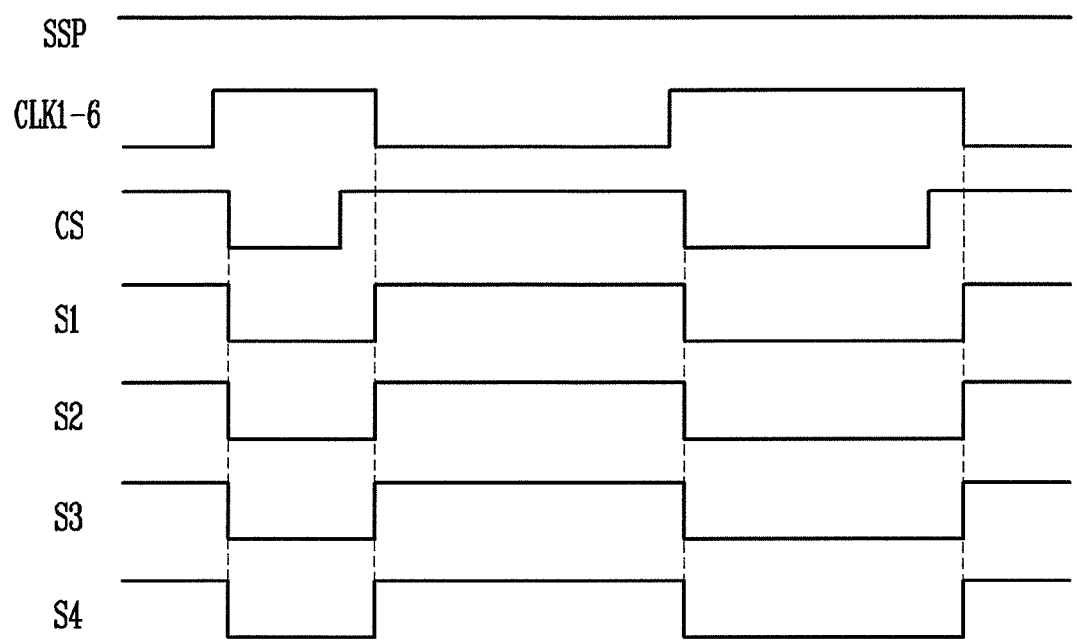
FIG. 15 is a waveform diagram illustrating a driving method for concurrently (e.g., simultaneously) outputting a scan signal in the scan driver of FIG. 13.

FIG. 15 is a waveform diagram illustrating a driving method for concurrently (e.g., simultaneously) outputting a scan signal by the scan driver of FIG. 13.

Referring to FIG. 15, the start signal SSP is not supplied (i.e., a gate-off voltage) during the scan signal is concurrently (e.g., simultaneously) outputted. The gate-on and gate-off voltages are repeated so that the clock signals CLK1 to CLK6 are synchronized with one another. The control signal CS is set to the gate-on voltage during at least a portion of the period in which the clock signals CLK1 to CLK6 have the gate-on voltage. The control signal CS is set to the gate-off voltage during the other portion of the period.

Then, the scan signal can be concurrently (e.g., simultaneously) supplied to the scan lines 51 to Sn, corresponding to the control signal CS. The concurrent driving method of FIG. 15 is substantially identical to that of FIG. 8, and therefore, its detailed description will be omitted.

Figure 16:
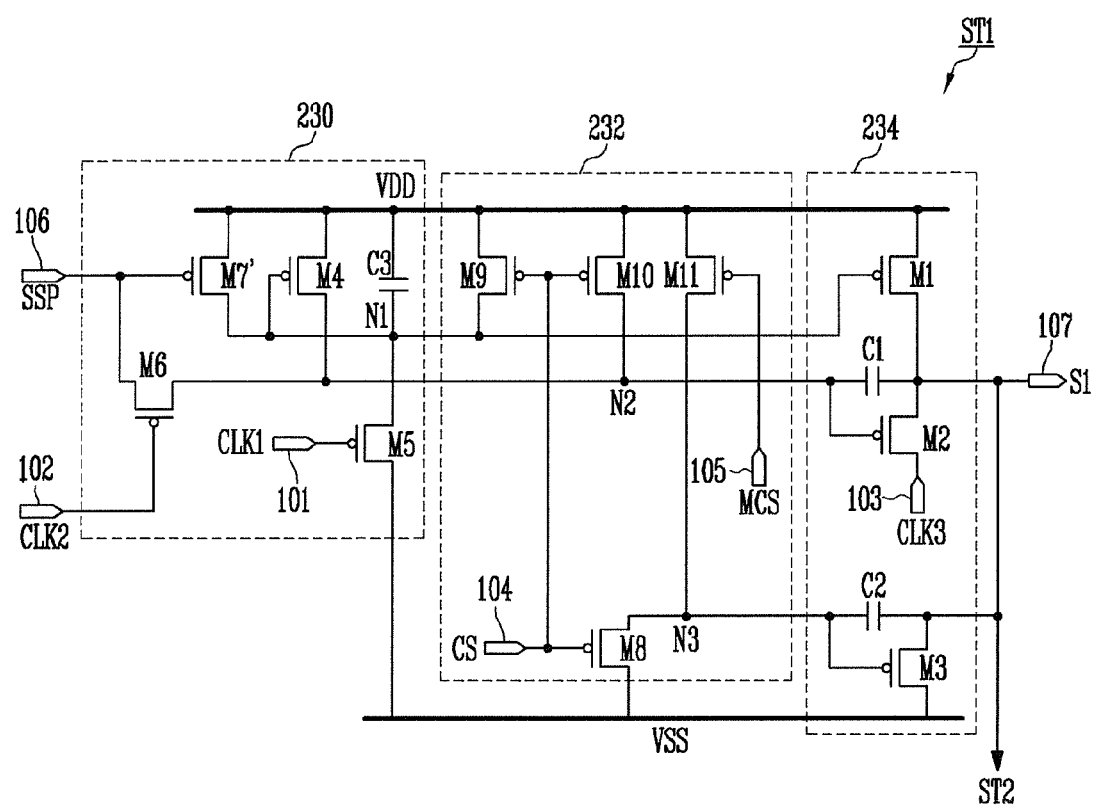
FIG. 16 is a circuit diagram schematically showing a third embodiment of the stage.

FIG. 16 is a circuit diagram schematically showing a third embodiment of the stage. In the description of FIG. 16, detailed descriptions of components identical to those of FIG. 3 will be omitted.

Referring to FIG. 16, the stage according to this embodiment includes a seventh transistor M7' coupled between the first power source VDD and the first node N1, and a third capacitor C3 coupled between the first node N1 and the first power source VDD. A gate electrode of the seventh transistor M7' is coupled to the sixth input terminal 106. When the start signal SSP is supplied to the sixth input terminal 106, the seventh transistor M7' is turned on so as to supply the voltage of the first power source VDD to the first node N1.

The third capacitor C3 is charged with a voltage applied to the first node N1.

The operating process of the stage will be described in conjunction with FIGS. 4 and 16. During a period in which a scan signal is progressively outputted, the mode control signal MCS is set to a gate-on voltage, and the control signal CS is set to a gate-off voltage.

When the control signal CS is set to the gate-off voltage, the eighth to tenth transistors M8 to M10 are turned off.

When the mode control signal MCS is set to the gate-on voltage, the eleventh transistor M11 is turned on. When the eleventh transistor M11 is turned on, the voltage of the first power source VDD is supplied to the third node N3, and accordingly, the third transistor M3 is turned off.

Then, the start signal SSP and the second clock signal CLK2 are supplied in synchronization with each other. When the second clock signal CLK2 is supplied, the sixth transistor M6 is turned on. When the sixth transistor M6 is turned on, the second node N2 is electrically coupled to the sixth input terminal 106. In this case, the start signal SSP is supplied to the second node N2.

When the start signal SSP is supplied, the seventh transistor MT is turned on. When the seventh transistor MT is turned on, the voltage of the first power source VDD is supplied to the first node N1, and accordingly, the first transistor M1 is turned off. A voltage corresponding to the first power source VDD is charged in the third capacitor C3.

When the start signal SSP is supplied to the second node N2, the second transistor M2 is turned on. When the second transistor M2 is turned on, the output terminal 107 is electrically coupled to the third input terminal 103. In this instance, the third clock signal CLK3 is not supplied to the third input terminal 103, and hence the scan signal is not supplied to the output terminal 107 (e.g., a high-level voltage is supplied). Here, a voltage corresponding to the turned-on state of the second transistor M2 is charged in the first capacitor C1 during the period in which the second transistor M2 is turned on.

Then, the supply of the second clock signal CLK2 and the start signal SSP is stopped, and the third clock signal CLK3 is supplied. When the supply of the second clock signal CLK2 is stopped, the sixth transistor M6 is turned off. When the supply of the start signal SSP is stopped, the seventh transistor M7' is turned off. In this instance, the second transistor M2 maintains a turned-on state corresponding to the voltage charged in the first capacitor C1, and the first transistor maintains a turned-off state corresponding to the voltage charged in the third capacitor C3.

When the second transistor M2 maintains the turned-on state, the third clock signal CLK3 supplied to the third input terminal 103 is supplied to the output terminal 107. The third clock signal CLK3 supplied to the output terminal 107 is supplied as a scan signal to the scan line S1 and concurrently (e.g., simultaneously) supplied to the next stage ST2. In this instance, the first capacitor C1 controls the voltage at the second node N2 corresponding to the voltage of the output terminal 107, and accordingly, the second transistor M2 stably maintains the turned-on state.

After the scan signal is supplied to the output terminal 107, the first clock signal CLK1 is supplied. When the first clock signal CLK1 is supplied, the fifth transistor M5 is turned on. When the fifth transistor M5 is turned on, the voltage of the second power source VSS is supplied to the first node N1.

When the voltage of the second power source VSS is supplied to the first node N1, the first and fourth transistors M1 and M4 are turned on. When the fourth transistor M4 is turned on, the voltage of the first power source VDD is supplied to the second node N2, and accordingly, the second transistor M2 is turned off. When the first transistor M1 is turned on, the voltage of the first power source VDD is supplied to the output terminal 107 (i.e., the supply of the scan signal is stopped).

Here, the second stage ST2 receives an output signal of the first stage ST1 in synchronization with the third clock signal CLK3. Accordingly, the second stage ST2 outputs the scan signal to the third scan line S3 in synchronization with the second clock signal CLK2.

Practically, the scan driver 10c can progressively supply the scan signal to the scan lines S1 to Sn while repeating the process described above.

Here, during a period in which the scan signal is concurrently (e.g., simultaneously) outputted as shown in FIG. 5, the seventh transistor M7' is turned on or off corresponding to the voltage supplied to the input terminal 106.

For example, in a case where the scan signal is supplied from the previous stage, the seventh transistor M7' is turned on. When the seventh transistor MT is turned on, the voltage of the first power source VDD is supplied to the first node N1 so that the first transistor M1 is turned off. That is, during a period in which the scan signal is concurrently (e.g., simultaneously) supplied, the seventh transistor MT is set to a turned-on stage so as to set the first transistor M1 to be in a turned-off state. Accordingly, the scan signal can be stably outputted. The other operating process is substantially identical to that of FIG. 3, and therefore, its detailed description will be omitted.

Figure 17:
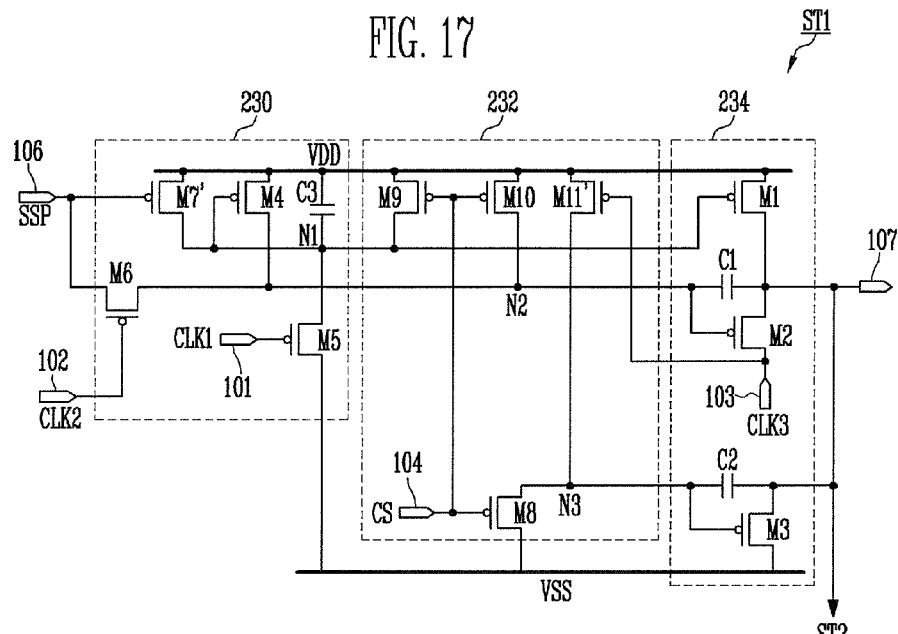
FIG. 17 is a circuit diagram schematically showing a fourth embodiment of the stage.

FIG. 17 is a circuit diagram schematically showing a fourth embodiment of the stage. In the description of FIG. 17, detailed descriptions of components identical to those of FIG. 16 will be omitted.

Referring to FIG. 17, the stage according to this embodiment includes an eleventh transistor M11' coupled between the first power source VDD and the third node N3. A gate electrode of the eleventh transistor M11' is coupled to the third input terminal 103. When the third clock signal CLK3 is supplied to the third input terminal, the eleventh transistor M11' is turned on. Otherwise, the eleventh transistor M11' is turned off. Practically, the operating process of the stage according to this embodiment is substantially identical to that of the stage of FIG. 11 except the eleventh transistor M11', and therefore, its detailed description will be omitted.

Figure 18:
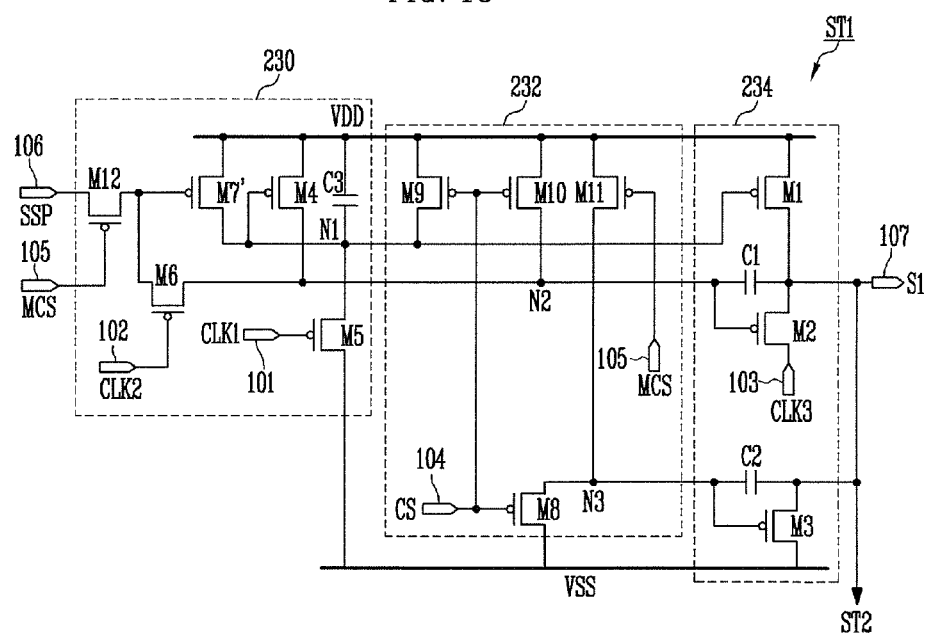
FIG. 18 is a circuit diagram schematically showing a fifth embodiment of the stage.

FIG. 18 is a circuit diagram schematically showing a fifth embodiment of the stage. In description of FIG. 18, detailed descriptions of components identical to those of FIG. 16 will be omitted.

Referring to FIG. 18, the stage according to this embodiment further includes a twelfth transistor M12 coupled between the gate electrode of the seventh transistor M7' and the sixth input terminal 106. A gate electrode of the twelfth transistor M12 is coupled to the fifth input terminal 105. When the mode control signal MCS is supplied to the fifth input terminal 105, the twelfth transistor M12 is turned on so that the sixth terminal 106 is coupled to the gate electrode of the seventh transistor MT. In this case, the seventh and fifth transistors MT and M5 may be formed to have the same resistance.

When a scan signal is progressively supplied, the mode control signal MCS is set to a gate-on voltage, and accordingly, the twelfth transistor M12 is set to be in a turned-on state. In this case, the operating process is substantially identical to that of FIG. 16, and therefore, its detailed description will be omitted.

Figure 19:
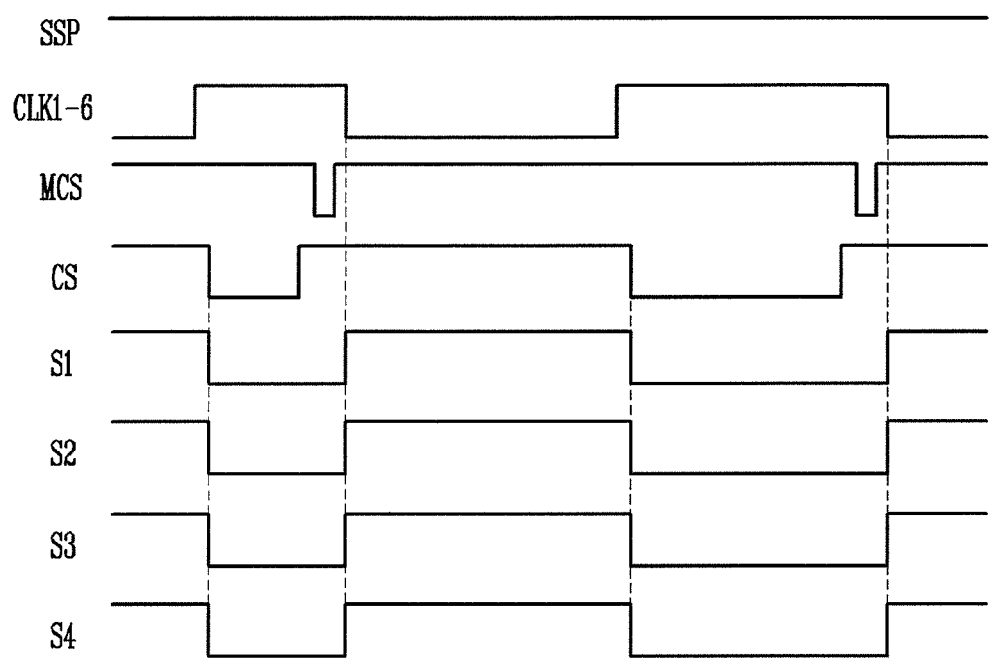
FIG. 19 is a waveform diagram illustrating a driving method for concurrently (e.g., simultaneously) outputting a scan signal using the stage circuit shown in FIG. 18.

FIG. 19 is a waveform diagram illustrating a driving method for concurrently (e.g., simultaneously) outputting a scan signal using the stage circuit shown in FIG. 18. Although it has been illustrated in FIG. 19 that six clock signals CLK1 to CLK 6 are supplied for convenience of illustration, the present invention is not limited thereto. Practically, only three clock signals CLK1 to CLK3 may be supplied, corresponding to the connection structure of the stage.

Referring to FIG. 19, the start signal SSP is not supplied during a period in which a scan signal is concurrently (e.g., simultaneously) outputted. The clock signals CLK1 to CLK6 repeat gate-on and gate-off voltages in synchronization with one another. The control signal CS is set to a gate-on voltage during a first period of the period in which the clock signal having a gate-off voltage is supplied. The mode control signal MCS is set to a gate-on voltage during a second period obtained by excluding the first period from the period in which the clock signal having the gate-off signal is supplied.

When the clock signals CLK1 to CLK6 are set to the gate-off voltage, the fifth and sixth transistors M5 and M6 are turned off.

When the control signal CS is supplied (i.e., the gate-on voltage), the eighth, ninth, and tenth transistors M8, M9, and M10 are turned on. When the ninth transistor M9 is turned on, the voltage of the first power source VDD is supplied to the first node N1, and accordingly, the first transistor M1 is turned off. When the tenth transistor M10 is turned on, the voltage of the first power source VDD is supplied to the second node N2, and accordingly, the second transistor M2 is turned off.

When the eighth transistor M8 is turned on, the voltage of the second power source VSS is supplied to the third node N3, and accordingly, the third transistor M3 is turned on. When the third transistor M3 is turned on, the voltage of the second power source VSS is supplied to the output terminal 107, and accordingly, the scan signal is concurrently (e.g., simultaneously) supplied to the scan lines S1 to Sn. The second capacitor C2 controls the voltage at the third node N3 corresponding to the voltage of the output terminal 107, and accordingly, the third transistor M3 stably maintains a turned-on state. Here, the twelfth transistor M12 is set to be in a turned-off state, and hence the gate signal of the previous stage, supplied to the sixth terminal 106, is not supplied to the current stage.

Then, the supply of the control signal CS is stopped, and the mode control signal MCS is supplied. When the mode control signal MCS is supplied, the eleventh and twelfth transistors M11 and M12 are turned off.

When the eleventh transistor M11 is turned on, the voltage of the first power source VDD is supplied to the third node N3. When the voltage of the first power source VDD is supplied to the third node N3, the third transistor M3 is turned off. In this instance, the voltage of the previous scan signal of each of the scan lines S1 to Sn is maintained by parasitic capacitance.

When the twelfth transistor M12 is turned on, the scan signal of the previous stage is supplied to the gate electrode of the seventh transistor M7' so that the seventh transistor M7' is turned on. When the seventh transistor M7' is turned on, the voltage of the first power source VDD is supplied to the first node N1.

Then, the clock signals CLK1 to CLK6 are supplied so that the fifth and sixth transistors M5 and M6 are turned on. When the fifth transistor M5 is turned on, the voltage of the second power source VSS is supplied to the first node N1, and accordingly, the first transistor M1 is turned on. When the first transistor M1 is turned on, the voltage of the first power source VDD is supplied to the output terminal 107.

When the sixth transistor M6 is turned on, the twelfth transistor M12 is electrically coupled to the second transistor M2. In this instance, the twelfth transistor M12 is set to be in a turned-off state, and accordingly, the second node N2 maintains the voltage of the first power source VDD supplied during the previous period.

Figure 20:
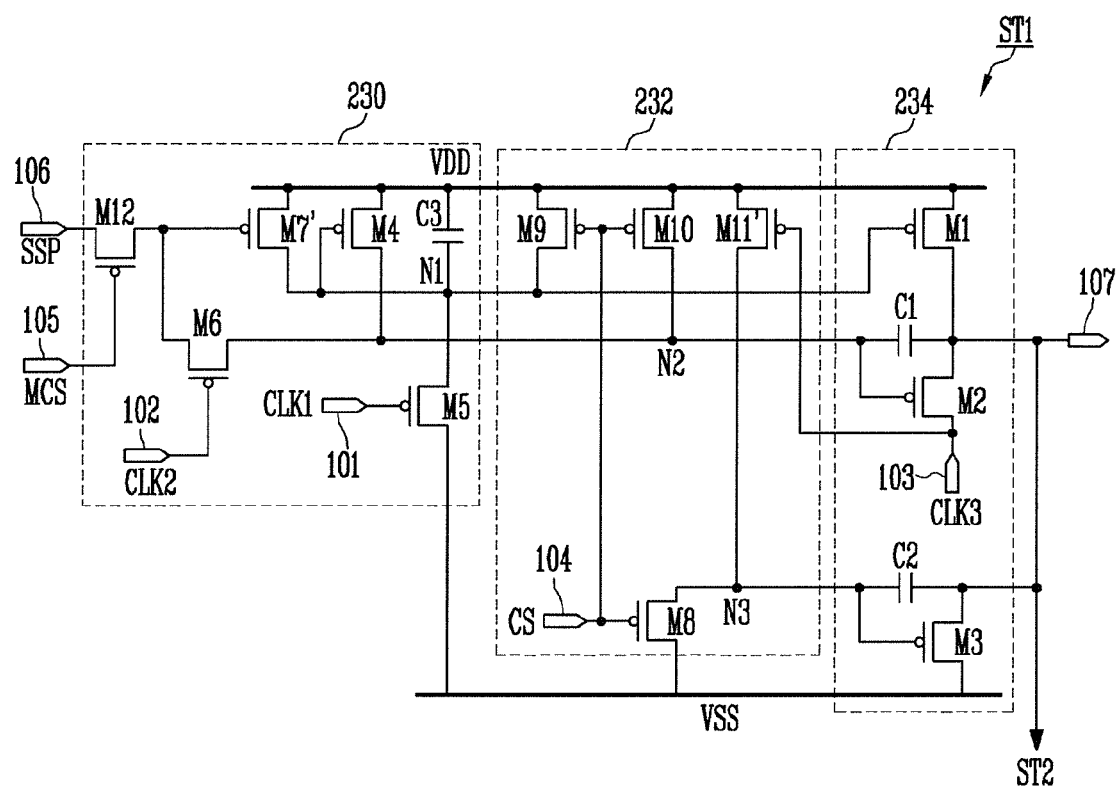
FIG. 20 is a circuit diagram schematically showing a sixth embodiment of the stage.

FIG. 20 is a circuit diagram schematically showing a sixth embodiment of the stage.

Referring to FIG. 20, in the stage according to this embodiment, the gate electrode of the eleventh transistor M11' is coupled to the third input terminal 103. Other components are identical to those in the stage shown in FIG. 16. Similarly, the seventh and fifth transistors M7 and M5 in this embodiment may be formed to have the same resistance.

Figure 21:
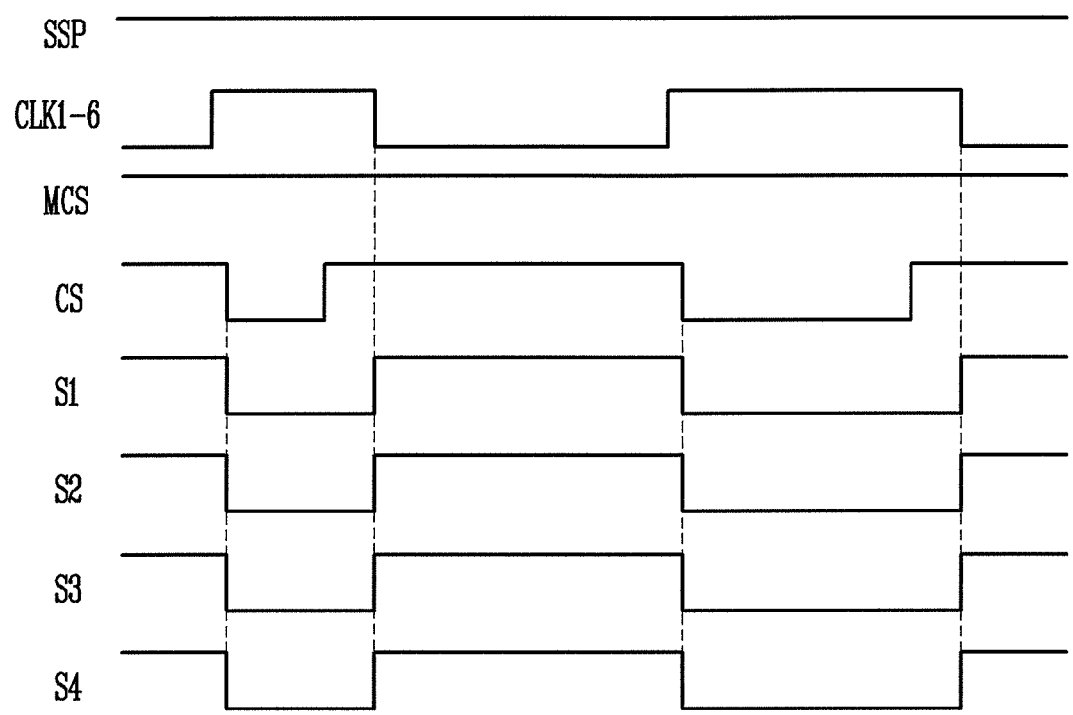
FIG. 21 is a waveform diagram illustrating a driving method for concurrently (e.g., simultaneously) outputting a scan signal using the stage circuit shown in FIG. 20.

FIG. 21 is a waveform diagram illustrating a driving method for concurrently (e.g., simultaneously) outputting a scan signal using the stage circuit shown in FIG. 20. Although it has been illustrated in FIG. 21 that first to sixth clock signals CLK1 to CLK 6 are supplied for convenience of illustration, the present invention is not limited thereto. Practically, only three clock signals CLK1 to CLK3 may be supplied, corresponding to the connection structure of the stage.

Referring to FIG. 21, during a period in which a scan signal is concurrently (e.g., simultaneously) supplied, the start signal SSP is not supplied, and the mode control signal MCS is set to a gate-off voltage.

When the mode control signal MCS is set to the gate-off voltage, the twelfth transistor M12 is turned off. In this case, the output of the previous stage has no influence on the driving of the current stage.

The clock signals CLK1 to CLK6 repeat gate-on and gate-off voltages in synchronization with one another. The control signal CS is set to a gate-on voltage during a portion of the period in which the clock signal having a gate-off voltage is supplied.

When the clock signals CLK1 to CLK6 are set to the gate-off voltage, the fifth and sixth transistors M5 and M6 are turned off.

When the control signal CS is supplied (i.e., the gate-on voltage), the eighth, ninth, and tenth transistors M8, M9, and M10 are turned on. When the ninth transistor M9 is turned on, the voltage of the first power source VDD is supplied to the first node N1, and accordingly, the first transistor M1 is turned off. When the tenth transistor M10 is turned on, the voltage of the first power source VDD is supplied to the second node N2, and accordingly, the second transistor M2 is turned off.

When the eighth transistor M8 is turned on, the voltage of the second power source VSS is supplied to the third node N3, and accordingly, the third transistor M3 is turned on. When the third transistor M3 is turned on, the voltage of the second power source VSS is supplied to the output terminal 107, and accordingly, the scan signal is concurrently (e.g., simultaneously) supplied to the scan lines S1 to Sn. The second capacitor C2 controls the voltage at the third node N3 corresponding to the voltage of the output terminal 107, and accordingly, the third transistor M3 stably maintains a turned-on state. Here, the twelfth transistor M12 is set to be in a turned-off state, and hence the gate signal of the previous stage, supplied to the sixth input terminal 106, is not supplied to the current stage.

Then, the clock signals CLK1 to CLK6 are supplied so that the fifth and sixth transistors M5 and M6 are turned on. When the fifth transistor M5 is turned on, the voltage of the first power source VDD is supplied to the first node N1, and accordingly, the first transistor M1 is turned on. When the first transistor M1 is turned on, the voltage of the first power source VDD is supplied to the output terminal 107.

When the sixth transistor M6 is turned on, the twelfth transistor M12 is electrically coupled to the second transistor M2. In this instance, the twelfth transistor M12 is set to be in a turned-off state, and accordingly, the second node N2 maintains the voltage of the first power source VDD, supplied during the previous period.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A stage circuit comprising:
    an output unit comprising a first transistor coupled between a first power source and an output terminal of the stage circuit, and having a gate electrode coupled to a first node; a second transistor coupled between the output terminal and a third input terminal of the stage circuit, and having a gate electrode coupled to a second node; and a third transistor coupled between the output terminal and a second power source, a gate electrode of the third transistor coupled to a third node;
    a progressive driver coupled to first, second, and sixth input terminals of the stage circuit, the progressive driver being configured to progressively output a scan signal by controlling voltages at the first, second, and third nodes during a first period; and
    a concurrent driver coupled to at least one of fourth and fifth input terminals of the stage circuit, the concurrent driver being configured to concurrently supply the scan signal by controlling the voltages at the first, second, and third nodes during a second period,
    wherein clock signals supplied to the first, second, and third input terminals during the second period are concurrently set to a gate-on or gate-off voltage.

2. The stage circuit according to claim 1, wherein the first power source is set to a gate-off voltage, and the second power source is set to a gate-on voltage.

3. The stage circuit according to claim 1, wherein the sixth input terminal is configured to receive an output signal of a previous stage or a start signal.

4. The stage circuit according to claim 1, wherein the output unit further comprises:
    a first capacitor coupled between the second node and the output terminal; and
    a second capacitor coupled between the third node and the output terminal.

5. The stage circuit according to claim 1, wherein the clock signals are supplied to the first, second, and third input terminals so that supply times of the gate-on voltage are not overlapped with one another during the first period.

6. The stage circuit according to claim 5, wherein the fourth input terminal is set to a gate off voltage during the first period, and is configured to receive a control signal in which gate-on and gate-off voltages are repeated, during the second period.

7. The stage circuit according to claim 6, wherein the control signal is supplied as the gate-on voltage during a portion of the period in which the clock signals are set to the gate-off voltage during the second period.

8. The stage circuit according to claim 6, wherein the progressive driver comprises:
    a fourth transistor coupled between the first power source and the second node, and having a gate electrode coupled to the first node;
    a fifth transistor coupled between the first node and the second power source, and having a gate electrode coupled to the first input terminal;
    a sixth transistor coupled between the second node and the sixth input terminal, and having a gate electrode coupled to the second input terminal; and
    a seventh transistor coupled between the first power source and the first node, and having a gate electrode coupled to the second node.

9. The stage circuit according to claim 8, wherein the signal supplied to the sixth input terminal during the first period is supplied in synchronization with the clock signal supplied to the second input terminal.

10. The stage circuit according to claim 8, wherein the seventh transistor is formed to have a higher resistance than that of the fifth transistor.

11. The stage circuit according to claim 6, wherein the concurrent driver comprises:
    an eighth transistor coupled between the second power source and the third node, and having a gate electrode coupled to the fourth input terminal;
    a ninth transistor coupled between the first power source and the first node, and having a gate electrode coupled to the fourth input terminal;
    a tenth transistor coupled between the first power source and the second node, and having a gate electrode coupled to the fourth input terminal; and
    an eleventh transistor coupled between the first power source and the third node, and having a gate electrode coupled to the fifth input terminal.

12. The stage circuit according to claim 11, wherein the fifth input terminal is set to a gate-on voltage during the first period, and receives a mode control signal set to a gate-on or gate-off voltage in synchronization with the clock signals during the second period.

13. The stage circuit according to claim 11, wherein the progressive driver comprises:
    a fourth transistor coupled between the first power source and the second node, and having a gate electrode coupled to the first node;
    a fifth transistor coupled between the first node and the second power source, and having a gate electrode coupled to the first input terminal;
    a twelfth transistor having a first electrode coupled to the sixth input terminal and a gate electrode coupled to the fifth input terminal;
    a sixth transistor coupled between a second electrode of the twelfth transistor and the second node, and having a gate electrode coupled to the second input terminal;
    a seventh transistor coupled between the first power source and the first node, and having a gate electrode coupled to the second electrode of the twelfth transistor; and
    a third capacitor coupled between the first power source and the first node.

14. The stage circuit according to claim 13, wherein the fifth input terminal is set to a gate-on voltage during the first period, and receives a mode control signal set to the gate-on voltage during a portion of the period in which the clock signals each having a gate-off voltage are supplied during the second period.

15. The stage circuit according to claim 14, wherein the mode control signal is set to the gate-on voltage during a period in which the control signal is set to the gate-off voltage.

16. The stage circuit according to claim 5, wherein the concurrent driver comprises:
- an eighth transistor coupled between the second power source and the third node, and having a gate electrode coupled to the fourth input terminal;
- a ninth transistor coupled between the first power source and the first node, and having a gate electrode coupled to the fourth input terminal;
- a tenth transistor coupled between the first power source and the second node, and having a gate electrode coupled to the fourth input terminal; and
- an eleventh transistor coupled between the first power source and the third node, and having a gate electrode coupled to the third input terminal.

17. The stage circuit according to claim 16, wherein the progressive driver comprises:
- a fourth transistor coupled between the first power source and the second node, and having a gate electrode coupled to the first node;
- a fifth transistor coupled between the first node and the second power source, and having a gate electrode coupled to the first input terminal;
- a twelfth transistor having a first electrode coupled to the sixth input terminal and a gate electrode coupled to the fifth input terminal;
- a sixth transistor coupled between a second electrode of the twelfth transistor and the second node, and having a gate electrode coupled to the second input terminal;
- a seventh transistor coupled between the first power source and the first node, and having a gate electrode coupled to the second electrode of the twelfth transistor; and
- a third capacitor coupled between the first power source and the first node.

18. The stage circuit according to claim 17, wherein the fifth input terminal is set to a gate-on voltage during the first period, and receives a mode control signal set to a gate-off voltage during a second period.

19. The stage circuit according to claim 1, wherein the progressive driver comprises:
- a fourth transistor coupled between the first power source and the second node, and having a gate electrode coupled to the first node;
- a fifth transistor coupled between the first node and the second power source, and having a gate electrode coupled to the first input terminal;
- a sixth transistor coupled between the second node and the sixth input terminal, and having a gate electrode coupled to the second input terminal; and
- a seventh transistor coupled between the first power source and the first node, and having a gate electrode coupled to the second input terminal.

20. A scan driver comprising stages respectively coupled to a plurality of scan lines for supplying a scan signal to the scan lines,
wherein each of the stages comprises:
- an output unit comprising a first transistor coupled between a first power source and an output terminal of the stage, and having a gate electrode coupled to a first node, a second transistor coupled between the output terminal and a third input terminal of the stage, and having a gate electrode coupled to a second node, and a third transistor coupled between the output terminal and a second power source having a lower voltage than that of the first power source, and having a gate electrode coupled to a third node;
- a progressive driver coupled to first, second, and sixth input terminals of the stage, the progressive driver being configured to progressively output the scan signal by controlling voltages at the first, second, and third nodes during a first period; and
- a concurrent driver coupled to at least one of fourth and fifth input terminals of the stage, the concurrent driver being configured to concurrently supply the scan signal by controlling the voltages at the first, second, and third nodes during a second period,
wherein clock signals supplied to the first, second, and third input terminals during the second period are concurrently set to a gate-on or gate-off voltage.

21. The scan driver according to claim 20, wherein first, second, and third clock signals are alternately inputted to the first, second, and third input terminals of the stages during the first period.

22. The scan driver according to claim 21, wherein the first, second, and third clock signals are progressively set to have a level of a gate-on voltage, and each of the first, second, and third clock signals has a cycle of three horizontal periods and a 1/3 duty ratio.

23. The scan driver according to claim 20, wherein first, third, and fifth clock signals are alternately inputted to the first, second, and third input terminals of odd-numbered stages among the stages during the first period; and second, fourth, and sixth clock signals are alternately inputted to the first, second, and third input terminals of even-numbered stages among the stages during the first period.

24. The scan driver according to claim 23, wherein the first to sixth clock signals are progressively are set to have the level of a gate-on voltage, and each of the first to sixth clock signals has a cycle of six horizontal periods and a 1/3 duty ratio.

25. The scan driver according to claim 20, wherein the fourth input terminal is set to a gate-off voltage during the first period, and receives a control signal in which gate-on and gate-off voltages are repeated, during the second period.

26. The scan driver according to claim 25, wherein the control signal is supplied as the gate-on voltage during a portion of the period in which the clock signals are not supplied, during the second period.

27. The scan driver according to claim 20, wherein the sixth input terminal receives an output signal of a previous stage or a start signal.

28. The scan driver according to claim 20, wherein the progressive driver comprises:
- a fourth transistor coupled between the first power source and the second node, and having a gate electrode coupled to the first node;
- a fifth transistor coupled between the first node and the second power source, and having a gate electrode coupled to the first input terminal;
- a sixth transistor coupled between the second node and the sixth input terminal, and having a gate electrode coupled to the second input terminal; and
- a seventh transistor coupled between the first power source and the first node, and having a gate electrode coupled to the second node.

29. The scan driver according to claim 20, wherein the concurrent driver comprises:
- an eighth transistor coupled between the second power source and the third node, and having a gate electrode coupled to the fourth input terminal;
- a ninth transistor coupled between the first power source and the first node, and having a gate electrode coupled to the fourth input terminal;
- a tenth transistor coupled between the first power source and the second node, and having a gate electrode coupled to the fourth input terminal; and an eleventh transistor coupled between the first power source and the third node, and having a gate electrode coupled to the fifth input terminal.

30. The scan driver according to claim 20, wherein the output unit further comprises:
a first capacitor coupled between the second node and the output terminal; and
a second capacitor coupled between the third node and the output terminal.

* * * * *